(12) United States Patent
Yamazaki

(10) Patent No.: US 11,380,800 B2
(45) Date of Patent: Jul. 5, 2022

(54) SEMICONDUCTOR DEVICE

(71) Applicant: Semiconductor Energy Laboratory Co., Ltd., Atsugi (JP)

(72) Inventor: Shunpei Yamazaki, Tokyo (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 16/925,383

(22) Filed: Jul. 10, 2020

(65) Prior Publication Data

US 2021/0020783 A1    Jan. 21, 2021

Related U.S. Application Data

(60) Continuation of application No. 15/834,131, filed on Dec. 7, 2017, now Pat. No. 10,714,626, which is a
(Continued)

(51) Int. Cl.
*H01L 29/786* (2006.01)
*H01L 29/49* (2006.01)
(Continued)

(52) U.S. Cl.
CPC ...... *H01L 29/7869* (2013.01); *H01L 27/1251* (2013.01); *H01L 29/4908* (2013.01);
(Continued)

(58) Field of Classification Search
CPC .............. H01L 29/7869; H01L 29/4908; H01L 51/0529; H01L 29/78693; H01L 51/0516;
(Continued)

(56) References Cited

U.S. PATENT DOCUMENTS 5,731,856 A    3/1998    Kim et al.
5,744,864 A    4/1998    Cillessen et al.
(Continued)

FOREIGN PATENT DOCUMENTS

CN    001405898 A    3/2003
CN    001806322 A    7/2006
(Continued)

OTHER PUBLICATIONS

International Search Report (Application No. PCT/JP2011/056488) dated Jun. 28, 2011.
(Continued)

*Primary Examiner* — Thanhha S Pham
(74) *Attorney, Agent, or Firm* — Fish & Richardson P.C.

(57)    ABSTRACT

The oxide semiconductor film has the top and bottom surface portions each provided with a metal oxide film containing a constituent similar to that of the oxide semiconductor film. An insulating film containing a different constituent from the metal oxide film and the oxide semiconductor film is further formed in contact with a surface of the metal oxide film, which is opposite to the surface in contact with the oxide semiconductor film. The oxide semiconductor film used for the active layer of the transistor is an oxide semiconductor film highly purified to be electrically i-type (intrinsic) by removing impurities such as hydrogen, moisture, a hydroxyl group, and hydride from the oxide semiconductor and supplying oxygen which is a major constituent of the oxide semiconductor and is simultaneously reduced in a step of removing impurities.

10 Claims, 10 Drawing Sheets

Related U.S. Application Data continuation of application No. 14/734,023, filed on Jun. 9, 2015, now Pat. No. 9,842,937, which is a division of application No. 13/074,597, filed on Mar. 29, 2011, now Pat. No. 9,059,295.

(51) Int. Cl.
*H01L 51/05* (2006.01)
*H01L 27/12* (2006.01)
*H01L 29/78* (2006.01)

(52) U.S. Cl.
CPC ........ *H01L 29/786* (2013.01); *H01L 29/7831* (2013.01); *H01L 29/78693* (2013.01); *H01L 51/0508* (2013.01); *H01L 51/0516* (2013.01); *H01L 51/0529* (2013.01); *H01L 27/1225* (2013.01)

(58) Field of Classification Search
CPC ............. H01L 27/1251; H01L 51/0508; H01L 29/786; H01L 29/7831; H01L 27/1225; H01L 29/66969
See application file for complete search history.

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,518,178 B2 | 4/2009 | Takashima et al. |
| 7,601,984 B2 | 10/2009 | Sano et al. |
| 7,674,650 B2 | 3/2010 | Akimoto et al. |
| 7,732,251 B2 | 6/2010 | Hoffman et al. |
| 7,732,819 B2 | 6/2010 | Akimoto et al. |
| 7,791,072 B2 | 9/2010 | Kumomi et al. |
| 7,884,360 B2 | 2/2011 | Takechi et al. |
| 7,906,780 B2 | 3/2011 | Iwasaki |
| 7,994,500 B2 | 8/2011 | Kim et al. |
| 8,049,225 B2 | 11/2011 | Yamazaki et al. |
| 8,058,645 B2 | 11/2011 | Jeong et al. |
| 8,093,589 B2 | 1/2012 | Sugihara et al. |
| 8,129,719 B2 | 3/2012 | Yamazaki et al. |
| 8,134,156 B2 | 3/2012 | Akimoto |
| 8,143,678 B2 | 3/2012 | Kim et al. |
| 8,148,779 B2 | 4/2012 | Jeong et al. |
| 8,158,464 B2 | 4/2012 | Akimoto |
| 8,188,480 B2 | 5/2012 | Itai |
| 8,202,365 B2 | 6/2012 | Umeda et al. |
| 8,203,143 B2 | 6/2012 | Imai |
| 8,203,144 B2 | 6/2012 | Hoffman et al. |
| 8,247,276 B2 | 8/2012 | Kondo et al. |
| 8,274,078 B2 | 9/2012 | Itagaki et al. |
| 8,319,905 B2 | 11/2012 | Yoon et al. |
| 8,343,817 B2 | 1/2013 | Miyairi et al. |
| 8,368,079 B2 | 2/2013 | Akimoto |
| 8,420,442 B2 | 4/2013 | Takechi et al. |
| 8,471,252 B2 | 6/2013 | Yamazaki et al. |
| 8,502,221 B2 | 8/2013 | Yamazaki |
| 8,525,165 B2 | 9/2013 | Akimoto |
| 8,558,323 B2 | 10/2013 | Kim et al. |
| 8,647,031 B2 | 2/2014 | Hoffman et al. |
| 8,729,547 B2 | 5/2014 | Miyairi et al. |
| 8,748,879 B2 | 6/2014 | Yano et al. |
| 8,785,240 B2 | 7/2014 | Watanabe |
| 8,785,242 B2 | 7/2014 | Yamazaki et al. |
| 8,889,480 B2 | 11/2014 | Takechi et al. |
| 8,890,152 B2 | 11/2014 | Yamazaki et al. |
| 8,900,917 B2 | 12/2014 | Yamazaki et al. |
| 8,946,703 B2 | 2/2015 | Miyairi et al. |
| 9,041,202 B2 | 5/2015 | Kimura |
| 9,059,295 B2 | 6/2015 | Yamazaki |
| 9,105,659 B2 | 8/2015 | Yamazaki et al. |
| 9,166,058 B2 | 10/2015 | Miyairi et al. |
| 9,209,026 B2 | 12/2015 | Takechi et al. |
| 9,236,456 B2 | 1/2016 | Miyairi et al. |
| 9,397,255 B2 | 7/2016 | Kimura |
| 9,437,748 B2 | 9/2016 | Miyairi et al. |
| 9,842,937 B2 | 12/2017 | Yamazaki |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0047785 A1 | 3/2003 | Kawasaki et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0051793 A1 | 3/2005 | Ishida et al. |
| 2005/0136637 A1 | 6/2005 | Li et al. |
| 2005/0199959 A1 | 9/2005 | Chiang et al. |
| 2005/0199960 A1 | 9/2005 | Hoffman et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0044714 A1 | 3/2007 | White |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0209576 A1 | 9/2007 | Sunkara et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |

(56) References Cited

U.S. PATENT DOCUMENTS

| | | |
|---|---|---|
| 2008/0166834 A1 | 7/2008 | Kim et al. |
| 2008/0182358 A1 | 7/2008 | Cowdery-Corvan et al. |
| 2008/0191204 A1 | 8/2008 | Kim et al. |
| 2008/0210934 A1 | 9/2008 | Koinuma et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308806 A1 | 12/2008 | Akimoto et al. |
| 2009/0008639 A1* | 1/2009 | Akimoto ........... H01L 29/66969 257/43 |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0127552 A1 | 5/2009 | Li et al. |
| 2009/0134399 A1 | 5/2009 | Sakakura et al. |
| 2009/0142887 A1 | 6/2009 | Son et al. |
| 2009/0152506 A1 | 6/2009 | Umeda et al. |
| 2009/0152541 A1 | 6/2009 | Maekawa et al. |
| 2009/0166616 A1 | 7/2009 | Uchiyama |
| 2009/0186437 A1 | 7/2009 | Akimoto |
| 2009/0186445 A1 | 7/2009 | Akimoto |
| 2009/0189155 A1 | 7/2009 | Akimoto |
| 2009/0206341 A1 | 8/2009 | Marks et al. |
| 2009/0236655 A1 | 9/2009 | Choi et al. |
| 2009/0278120 A1 | 11/2009 | Lee et al. |
| 2009/0278122 A1 | 11/2009 | Hosono et al. |
| 2009/0280600 A1 | 11/2009 | Hosono et al. |
| 2009/0321731 A1 | 12/2009 | Jeong et al. |
| 2009/0321732 A1 | 12/2009 | Kim et al. |
| 2010/0003783 A1 | 1/2010 | Akimoto |
| 2010/0006833 A1 | 1/2010 | Ha et al. |
| 2010/0032668 A1 | 2/2010 | Yamazaki et al. |
| 2010/0038641 A1 | 2/2010 | Imai |
| 2010/0044711 A1 | 2/2010 | Imai |
| 2010/0051937 A1 | 3/2010 | Kaji et al. |
| 2010/0059746 A1 | 3/2010 | Itai |
| 2010/0065837 A1 | 3/2010 | Omura et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0163863 A1 | 7/2010 | Yaegashi |
| 2010/0200843 A1 | 8/2010 | Arai et al. |
| 2010/0244022 A1 | 9/2010 | Takahashi et al. |
| 2010/0264412 A1 | 10/2010 | Yamazaki et al. |
| 2010/0295041 A1 | 11/2010 | Kumomi et al. |
| 2010/0320458 A1 | 12/2010 | Umeda et al. |
| 2010/0320459 A1 | 12/2010 | Umeda et al. |
| 2011/0065216 A1 | 3/2011 | Kaji et al. |
| 2011/0095195 A1 | 4/2011 | Imai |
| 2011/0095288 A1 | 4/2011 | Morosawa et al. |
| 2011/0175090 A1 | 7/2011 | Sugihara et al. |
| 2011/0193083 A1 | 8/2011 | Kim et al. |
| 2011/0240990 A1 | 10/2011 | Yamazaki |
| 2011/0240992 A1 | 10/2011 | Yamazaki |
| 2011/0240993 A1 | 10/2011 | Yamazaki |
| 2011/0240994 A1 | 10/2011 | Yamazaki |
| 2011/0240995 A1 | 10/2011 | Yamazaki |
| 2011/0248260 A1 | 10/2011 | Yamazaki |
| 2011/0318875 A1 | 12/2011 | Yamazaki et al. |
| 2012/0119205 A1 | 5/2012 | Taniguchi et al. |
| 2012/0132908 A1 | 5/2012 | Sugihara et al. |
| 2012/0286278 A1 | 11/2012 | Kondo et al. |
| 2013/0009209 A1 | 1/2013 | Yamazaki |
| 2013/0157393 A1 | 6/2013 | Kimura |
| 2013/0313550 A1 | 11/2013 | Yamazaki |
| 2014/0175437 A1 | 6/2014 | Uchiyama |
| 2015/0069389 A1 | 3/2015 | Yamazaki et al. |
| 2016/0300862 A1 | 10/2016 | Kimura |
| 2016/0372608 A1 | 12/2016 | Miyairi et al. |
| 2017/0330902 A1 | 11/2017 | Kimura |

FOREIGN PATENT DOCUMENTS

| | | |
|---|---|---|
| CN | 101165906 A | 4/2008 |
| CN | 101283444 A | 10/2008 |
| EP | 1737044 A | 12/2006 |
| EP | 2141743 A | 1/2010 |
| EP | 2141744 A | 1/2010 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 03-171775 A | 7/1991 |
| JP | 04-326769 A | 11/1992 |
| JP | 05-251705 A | 9/1993 |
| JP | 06-151850 A | 5/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-273361 A | 9/2003 |
| JP | 2004-103957 A | 4/2004 |
| JP | 2004-273614 A | 9/2004 |
| JP | 2004-273732 A | 9/2004 |
| JP | 2005-033172 A | 2/2005 |
| JP | 2005-332718 A | 12/2005 |
| JP | 2006-165528 A | 6/2006 |
| JP | 2007-066986 A | 3/2007 |
| JP | 2007-073701 A | 3/2007 |
| JP | 2007-073704 A | 3/2007 |
| JP | 2007-165468 A | 6/2007 |
| JP | 2007-201366 A | 8/2007 |
| JP | 2007-258223 A | 10/2007 |
| JP | 2007-529119 | 10/2007 |
| JP | 2008-042088 A | 2/2008 |
| JP | 2008-199005 A | 8/2008 |
| JP | 2008-218495 A | 9/2008 |
| JP | 2008-281988 A | 11/2008 |
| JP | 2009-099847 A | 5/2009 |
| JP | 2009-170905 A | 7/2009 |
| JP | 2009-224737 A | 10/2009 |
| JP | 2009-231613 A | 10/2009 |
| JP | 2009-277701 A | 11/2009 |
| JP | 2009-283554 A | 12/2009 |
| JP | 2009-302520 A | 12/2009 |
| JP | 2010-016163 A | 1/2010 |
| JP | 2010-016347 A | 1/2010 |
| JP | 2010-016348 A | 1/2010 |
| JP | 4415062 | 2/2010 |
| JP | 2010-062548 A | 3/2010 |
| JP | 2010-062549 A | 3/2010 |
| JP | 2010-067954 A | 3/2010 |
| JP | 2010-074061 A | 4/2010 |
| JP | 4571221 | 10/2010 |
| KR | 2003-0022692 A | 3/2003 |
| KR | 2006-0132720 A | 12/2006 |
| KR | 2009-0071358 A | 7/2009 |
| KR | 2009-0130089 A | 12/2009 |
| KR | 2010-0019357 A | 2/2010 |
| KR | 2010-0019379 A | 2/2010 |
| WO | WO-2004/114391 | 12/2004 |
| WO | WO-2005/093850 | 10/2005 |
| WO | WO-2007/058329 | 5/2007 |
| WO | WO-2007/086291 | 8/2007 |
| WO | WO-2008/105250 | 9/2008 |
| WO | WO-2008/126879 | 10/2008 |
| WO | WO-2008/133345 | 11/2008 |

(56) References Cited

FOREIGN PATENT DOCUMENTS

| WO | WO-2008/136505 | 11/2008 |
|----|----------------|---------|
| WO | WO-2009/139428 | 11/2009 |

OTHER PUBLICATIONS

Written Opinion (Application No. PCT/JP2011/056488) dated Jun. 28, 2011.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,Or Zn] at Temperatures Over 1000° C", Journal of Solid State Chemistry, 1985, vol. 60, pp. 382-384.
Nakamura.M et al., "The phase relations in the In2O3—Ga2ZnO4—ZnO system at 1350° C", Journal of Solid State Chemistry, Aug. 1, 1991, vol. 93, No. 2, pp. 298-315.
Kitzerow.H et al., "Observation of Blue Phases in Chiral Networks", Liquid Crystals, 1993, vol. 14, No. 3, pp. 911-916.
Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Kikuchi.H et al., "Polymer-Stabilized Liquid Crystal Blue Phases", Nature Materials, Sep. 2, 2002, vol. 1, pp. 64-68.
Tsuda.K et al., "Ultra Low Power Consumption Technologies for Mobile TFT-LCDs", IDW'02 : Proceedings of the 9th International Display Workshops, Dec. 4, 2002, pp. 295-298.
Nomura.K et al., "Thin-Film Transistor Fabricated in Single-Crystalline Transparent Oxide Semiconductor", Science, May 23, 2003, vol. 300, No. 5623, pp. 1269-1272.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.
Lee.H et al., "Current Status of, Challenges to, and Perspective View of AM-OLED", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.
Park.S et al., "Challenge to Future Displays: Transparent AM-OLED Driven by PEALD Grown ZnO TFT", IMID '07 Digest, 2007, pp. 1249-1252.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Miyasaka.M, "SUFTLA Flexible Microelectronics on Their Way to Business", SID Digest '07 : SID International Symposium Digest of Technical Papers, 2007, vol. 38, pp. 1673-1676.
Kurokawa.Y et al., "UHF RFCPUS on Flexible and Glass Substrates for Secure RFID Systems", Journal of Solid-State Circuits , 2008, vol. 43, No. 1, pp. 292-299.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Osada.T et al.,"15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

(56) References Cited

OTHER PUBLICATIONS

Osada.T et al., "Development of Driver-Integrated Panel Using Amorphous In—Ga—Zn-Oxide TFT", AM-FPD '09 Digest of Technical Papers, Jul. 1, 2009, pp. 33-36.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Park.J et al., "High performance amorphous oxide thin film transistors with self-aligned top-gate structure", IEDM 09: Technical Digest of International Electron Devices Meeting, Dec. 7, 2009, pp. 191-194.
Nakamura.M, "Synthesis of Homologous Compound with New Long-Period Structure", NIRIM Newsletter, Mar. 1, 1995, vol. 150, pp. 1-4.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Orita.M et al., "Amorphous transparent conductive oxide InGaO3(ZnO)m (m<4):a Zn4s conductor", Philosophical Magazine, 2001, vol. 81, No. 5, pp. 501-515.
Janotti.A et al., "Oxygen Vacancies in ZnO", Appl. Phys. Lett. (Applied Physics Letters), 2005, vol. 87, pp. 122102-1-122102-3.
Clark.S et al., "First Principles Methods Using Castep", Zeitschrift fur Kristallographie, 2005, vol. 220, pp. 567-570.
Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, p. 045501-1-045501-4.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Mo.Y et al., "Amorphous Oxide TFT Backplanes for Large Size AMOLED Displays", IDW '08 : Proceedings of the 6th International Display Workshops, Dec. 3, 2008, pp. 581-584.
Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.
Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.
Nakayama.M et al., "17a-TL-8 Effect of GaO Layer on IGZO-TFT Channel", Extended Abstracts (The 57th Spring Meeting 2010), The Japan Society of Applied Physics and Related Societies, Mar. 17, 2010, pp. 21-008.
Chinese Office Action (Application No. 201180016101.2) dated Dec. 1, 2014.
Chinese Office Action (Application No. 201180016101.2) dated Jul. 13, 2015.
Korean Office Action (Application No. 2012-7027962) dated Jun. 29, 2017.
Korean Office Action (Application No. 2018-7007393) dated Jun. 12, 2018.

* cited by examiner

SEMICONDUCTOR DEVICE

CROSS-REFERENCE TO RELATED APPLICATIONS

This application is a continuation of U.S. application Ser. No. 15/834,131 filed Dec. 7, 2017, now allowed, which is a continuation of U.S. application Ser. No. 14/734,023 filed Jun. 9, 2015, now U.S. Pat. No. 9,842,937, which is a divisional of U.S. application Ser. No. 13/074,597 filed Mar. 29, 2011, now U.S. Pat. No. 9,059,295, which claims the benefit of a foreign priority application filed in Japan as Serial No. 2010-086397 on Apr. 2, 2010, all of which are incorporated by reference.

TECHNICAL FIELD

The present invention relates to a semiconductor device and a manufacturing method thereof.

In this specification, a semiconductor device means a general device which can function by utilizing semiconductor characteristics, and an electrooptic device, a semiconductor circuit, and an electronic device are all semiconductor devices.

BACKGROUND ART

A technique by which transistors are formed using semiconductor thin films formed over a substrate having an insulating surface has been attracting attention. Such transistors are applied to a wide range of electronic devices such as an integrated circuit (IC) and an image display device (display device). As semiconductor thin films applicable to the transistors, silicon-based semiconductor materials have been widely used, but oxide semiconductors have been attracting attention as alternative materials.

For example, disclosed is a transistor whose active layer is formed using an amorphous oxide containing indium (In), gallium (Ga), and zinc (Zn) and having an electron carrier concentration of lower than $10^{18}/cm^3$ (see Patent Document 1).

A transistor including an oxide semiconductor is known to have a problem of low reliability because of high possibility of change in electric characteristics, although the transistor including an oxide semiconductor can be operated at higher speed than a transistor including amorphous silicon and can be manufactured more easily than a transistor including polycrystalline silicon. For example, the threshold voltage of the transistor fluctuates after a BT test performed under light. On the other hand, Patent Documents 2 and 3 each disclose a technique of preventing charge trapping at the interface of an oxide semiconductor layer with the use of an interfacial stability layer, which is provided on at least one of the top surface and the bottom surface of the oxide semiconductor layer, in order to suppress the shift of the threshold voltage of the transistor including an oxide semiconductor.

REFERENCE

[Patent Document 1] Japanese Published Patent Application No. 2006-165528
[Patent Document 2] Japanese Published Patent Application No. 2010-016347
[Patent Document 3] Japanese Published Patent Application No. 2010-016348

DISCLOSURE OF INVENTION

The transistor disclosed in Patent Document 2 or 3, however, includes as the interfacial stability layer a layer having a property similar to those of a gate insulating layer and a protective layer, so that the state of the interface with an active layer cannot be kept favorably. This is why it is difficult to suppress charge trapping at the interface between the active layer and the interfacial stability layer. In particular, in the case where the interfacial stability layer and the active layer have equivalent band gaps, charge is likely to be stored.

Thus, a transistor including an oxide semiconductor cannot yet be said to have sufficiently high reliability.

In view of the above problems, an object is to stabilize electric characteristics of a semiconductor device including an oxide semiconductor to increase reliability.

One embodiment of the disclosed invention is based on the following technical idea: an oxide semiconductor film as an active layer is not directly in contact with an insulating film such as a gate insulating film or a protective insulating film, and a metal oxide film is provided between and in contact with these films and contains a constituent similar to that of the oxide semiconductor film. In other words, one embodiment of the disclosed invention includes a layered structure of an oxide semiconductor film, a metal oxide film, and an insulating film containing a different constituent from the oxide semiconductor film and the metal oxide film. Here, containing "a constituent similar to that of the oxide semiconductor film" means containing one or more of metal elements selected from constituents of the oxide semiconductor film.

Such a layered structure makes it possible to sufficiently suppress trapping of charge or the like, which is generated due to the operation of a semiconductor device, or the like, at the interface of the insulating film and the oxide semiconductor film. This advantageous effect is brought by the following mechanism: the metal oxide film containing a material compatible with the oxide semiconductor film is provided in contact with the oxide semiconductor film, whereby suppressed is trapping of charge or the like, which can be generated due to the operation of a semiconductor device, at the interface between the oxide semiconductor film and the metal oxide film. Meanwhile, the insulating film containing a material with which a charge trapping center can be formed at the interface is provided in contact with the metal oxide film, whereby the charge can be trapped at the interface between the metal oxide film and the insulating film.

That is to say, in the case where a large amount of charge is generated, it is difficult to suppress trapping of charge at the interface between the oxide semiconductor film and the metal oxide film, only with the metal oxide film; however, when the insulating film is provided in contact with the metal oxide film, charge is trapped preferentially at the interface between the metal oxide film and the insulating film, so that trapping of charge at the interface between the oxide semiconductor film and the metal oxide film can be suppressed. Thus, it can be said that the advantageous effect of one embodiment of the disclosed invention is attributed to the layered structure of the oxide semiconductor film, the metal oxide film, and the insulating film and is different from an effect due to a layered structure of an oxide semiconductor film and a metal oxide film.

Since trapping of charge at the interface of the oxide semiconductor film can be suppressed and a charge trapping center can be kept away from the oxide semiconductor film, operation malfunctions of the semiconductor device can be reduced to increase reliability of the semiconductor device.

In the above mechanism, the metal oxide film desirably has an enough thickness. This is because the influence of charge trapped at the interface between the metal oxide film and the insulating film may be great when the metal oxide film is thin. For example, the metal oxide film is preferably thicker than the oxide semiconductor film.

The metal oxide film having an insulating property is formed so as not to hinder connection between the oxide semiconductor film and source and drain electrodes, so that resistance can be prevented from being increased as compared to the case where a metal oxide film is provided between an oxide semiconductor film and a source electrode or a drain electrode. Thus, it is possible to suppress deterioration of electric characteristics of the transistor.

When the composition of an oxide semiconductor differs from the stoichiometric composition because of an excess or a deficiency of oxygen, or hydrogen or moisture which serves as an electron donor enters the oxide semiconductor in a thin film formation process, the conductivity of the oxide semiconductor is changed. Such a phenomenon is a factor of a change in electric characteristics of the transistor including such an oxide semiconductor. Therefore, an oxide semiconductor film is highly purified to be electrically i-type (intrinsic) by intentionally removing impurities such as hydrogen, moisture, a hydroxyl group, and hydride (also referred to as a hydrogen compound) from the oxide semiconductor and supplying oxygen which is a major constituent of the oxide semiconductor and is simultaneously reduced in a step of removing impurities.

An i-type (intrinsic) oxide semiconductor is an oxide semiconductor highly purified to be i-type (intrinsic) or substantially i-type (intrinsic) by removing hydrogen, which is an n-type impurity, from the oxide semiconductor so that impurities that are not main components of the oxide semiconductor are contained as little as possible.

Note that in the process of making an oxide semiconductor film intrinsic, a metal oxide film containing a constituent similar to that of the oxide semiconductor film may also be made intrinsic at the same time. According to one embodiment of the disclosed invention, metal oxide films provided on a top surface and a bottom surface of an oxide semiconductor film are desirably made electrically intrinsic by sufficiently reducing impurities such as moisture and hydrogen.

The electric characteristics of a transistor including a highly-purified oxide semiconductor film, such as the threshold voltage and an off-state current, have almost no temperature dependence. Further, transistor characteristics are less likely to change due to light deterioration.

One embodiment of the present invention is a semiconductor device including a gate electrode; a gate insulating film covering the gate electrode; a first metal oxide film in contact with the gate insulating film; an oxide semiconductor film in contact with the first metal oxide film and in a region overlapping with the gate electrode; source and drain electrodes in contact with the oxide semiconductor film; a second metal oxide film in contact with the oxide semiconductor film; and an insulating film covering the second metal oxide film.

In the above semiconductor device, the second metal oxide film is preferably provided so as to cover the source and drain electrodes and contact the first metal oxide film. The oxide semiconductor film is preferably surrounded by the first metal oxide film and the second metal oxide film.

In the above semiconductor device, at least part of a top surface of the oxide semiconductor film may be in contact with the source and drain electrodes. In that case, side edges of the oxide semiconductor film in a channel length direction may be aligned with those of the first metal oxide film.

In the above semiconductor device, at least part of a top surface of the source electrode and part of a top surface of the drain electrode may be in contact with the oxide semiconductor film In that case, side edges of the oxide semiconductor film in a channel length direction may be aligned with those of the second metal oxide film.

In any of the above semiconductor devices, the first metal oxide film and the second metal oxide film each preferably contain a constituent element of the oxide semiconductor film.

In any of the above semiconductor devices, the first metal oxide film and the second metal oxide film each preferably have a larger energy gap than the oxide semiconductor film.

In any of the above semiconductor devices, energy at the bottom of the conduction band of each of the first metal oxide film and the second metal oxide film is preferably higher than that at the bottom of the conduction band of the oxide semiconductor film.

In any of the above semiconductor devices, the first metal oxide film and the second metal oxide film each preferably contain a gallium oxide. The proportion of a constituent element of the first metal oxide film is preferably equal to that of a constituent element of the second metal oxide film.

In any of the above semiconductor devices, a conductive film may be provided over the oxide film.

In the above, the channel length L of the transistor, which depends on the distance between the source electrode and the drain electrode, can be longer than or equal to 10 nm and shorter than or equal to 10 μm, for example, 0.1 μm to 0.5 μm. It is needless to say that the channel length L may be longer than or equal to 1 nm. The channel width W may be longer than or equal to 10 nm.

According to one embodiment of the present invention, a transistor having stable electric characteristics can be manufactured.

According to one embodiment of the present invention, a semiconductor device including a highly reliable transistor having favorable electric characteristics can be manufactured.

BEST MODE FOR CARRYING OUT THE INVENTION

Hereinafter, embodiments of the present invention will be described in detail with reference to the drawings. Note that the present invention is not limited to the following description, and it will be easily understood by those skilled in the art that modes and details disclosed herein can be modified in various ways without departing from the spirit and the scope of the present invention. Thus, the present invention should not be construed as being limited to the following description of the embodiments.

Note that the ordinal numbers such as "first" and "second" in this specification are used for convenience and do not denote the order of steps or the stacking order of layers. In addition, the ordinal numbers in this specification do not denote particular names which specify the present invention.

Embodiment 1

In this embodiment, an embodiment of a semiconductor device and a manufacturing method thereof will be described with reference to FIGS. 1A to 1C, FIG. 2, FIGS. 3A to 3G;

FIGS. 4A to 4E, and FIGS. 5A to 5C.

<Structural Example of Semiconductor Device>

Figure 1A:
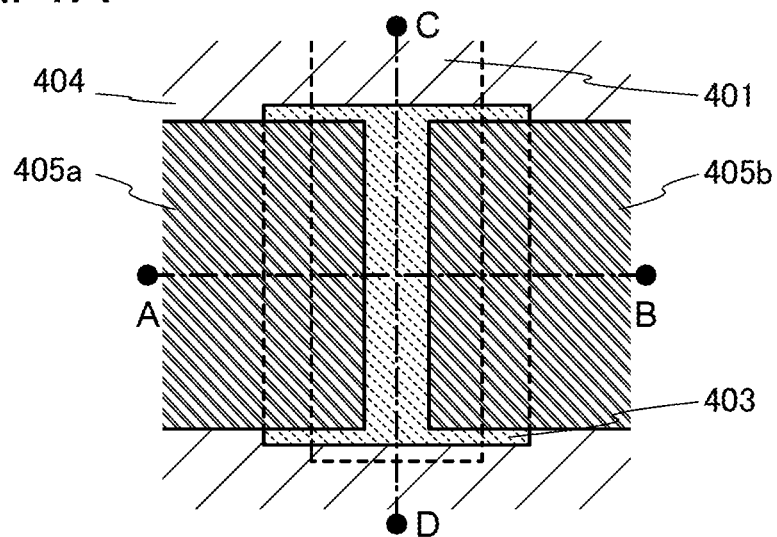
FIGS. 1A to 1C are a plan view and cross-sectional views illustrating an embodiment of a semiconductor device.
Figure 1B:
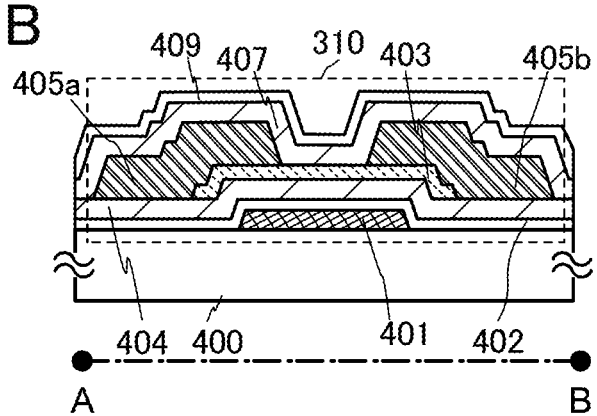
Figure 1C:
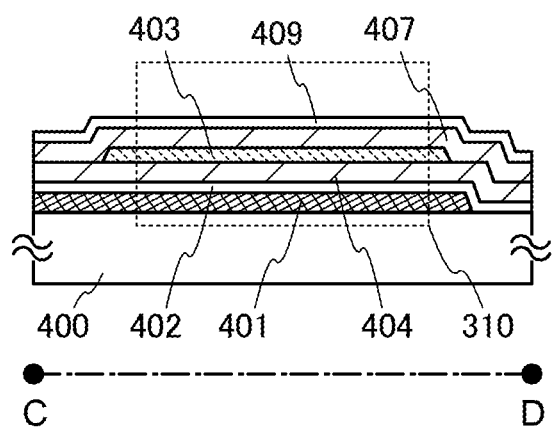

FIGS. 1A to 1C are a plan view and cross-sectional views of a bottom-gate transistor as an example of a semiconductor device. Here, FIG. 1A is a plan view, FIG. 1B is a cross-sectional view along A-B of FIG. 1A, and FIG. 1C is a cross-sectional view along C-D of FIG. 1A. Note that part of components of a transistor 310 (e.g., a second metal oxide film 407) is omitted for brevity.

The transistor 310 in FIGS. 1A to 1C includes, over a substrate 400 having an insulating surface, a gate electrode 401, a gate insulating film 402, a first metal oxide film 404, an oxide semiconductor film 403, a source electrode 405a, a drain electrode 405b, a second metal oxide film 407, and an insulating film 409.

In the transistor in FIGS. 1A to 1C, the second metal oxide film 407 is formed so as to cover the source electrode 405a and the drain electrode 405b and contact the first metal oxide film 404 and the oxide semiconductor film 403. In addition, in FIGS. 1B and 1C, the first metal oxide film 404 and the second metal oxide film 407 are in contact with each other in a region where the oxide semiconductor film 403 does not exist. In other words, the oxide semiconductor film 403 is surrounded by the first metal oxide film 404 and the second metal oxide film 407.

Here, it is desirable to use an oxide containing a constituent similar to that of the oxide semiconductor film 403 for the first metal oxide film 404 and the second metal oxide film 407. Specifically, the first metal oxide film 404 and the second metal oxide film 407 are each preferably a film containing an oxide containing one or more of metal elements selected from constituent elements of the oxide semiconductor film. Such a material is compatible with the oxide semiconductor film 403; thus, when it is used for the first metal oxide film 404 and the second metal oxide film 407, the state of the interface between the oxide semiconductor film and each of the first metal oxide film 404 and the second metal oxide film 407 can be kept favorably. That is to say, the use of the above material for the first metal oxide film 404 and the second metal oxide film 407 makes it possible to suppress trapping of charge at the interface between the oxide semiconductor film and the metal oxide film in contact with the oxide semiconductor film (here, the interface between the first metal oxide film 404 and the oxide semiconductor film 403 and the interface between the second metal oxide film 407 and the oxide semiconductor film 403).

Note that the first metal oxide film 404 and the second metal oxide film 407 are each a film containing a constituent similar to that of the oxide semiconductor film 403. Therefore, in the case where the first metal oxide film 404 and the second metal oxide film 407 are in contact with each other in a region where the oxide semiconductor film 403 does not exist, the adhesion between the first metal oxide film 404 and the second metal oxide film 407 can be improved. Further, it is more desirable that the proportion of constituent elements of the first metal oxide film 404 be equal to that of the second metal oxide film 407.

The first metal oxide film 404 and the second metal oxide film 407 each need to have a larger energy gap than the oxide semiconductor film 403 because the oxide semiconductor film 403 is used as an active layer. In addition, it is necessary that an energy barrier be formed between the first metal oxide film 404 and the oxide semiconductor film 403 or between the second metal oxide film 407 and the oxide semiconductor film 403 so that carriers do not flow from the oxide semiconductor film 403 at room temperature (20° C.). For example, the energy difference between the bottom of the conduction band of the oxide semiconductor film 403 and the bottom of the conduction band of the first metal oxide film 404 or the second metal oxide film 407 or the energy difference between the top of the valence band of the oxide semiconductor film 403 and the top of the valence band of the first metal oxide film 404 or the second metal oxide film 407 is desirably 0.5 eV or more, more desirably 0.7 eV or more. In addition, the energy difference therebetween is desirably 1.5 eV or less.

Specifically, for example, in the case where an In—Ga—Zn—O-based material is used for the oxide semiconductor film 403, the first metal oxide film 404 and the second metal oxide film 407 may be formed using a material containing gallium oxide, or the like. In the case where the gallium oxide is in contact with the In—Ga—Zn—O-based material, the energy barrier is about 0.8 eV on the conduction band side and about 0.9 eV on the valence band side.

Note that a gallium oxide is also referred to as GaO' and the value of x is preferably set so that the oxygen amount exceeds the stoichiometric proportion. For example, the value of x is preferably set to larger than or equal to 1.4 and smaller than or equal to 2.0, more preferably larger than or equal to 1.5 and smaller than or equal to 1.8. Note that a gallium oxide film may contain an impurity element other than hydrogen, e.g., an element belonging to Group 3 such as yttrium, an element belonging to Group 4 such as hafnium, an element belonging to Group 13 such as aluminum, an element belonging to Group 14 such as silicon, or nitrogen so that the energy gap of the gallium oxide is increased to improve the insulating property. The energy gap of a gallium oxide film which does not contain an impurity is 4.9 eV; however, when the gallium oxide film contains any of the above impurities at about greater than 0 atomic % and less than or equal to 20 atomic %, the energy gap can be increased to about 6 eV.

Considering that charge sources and charge trapping centers should be reduced, it is desirable to sufficiently reduce impurities such as hydrogen and water in the metal oxide film. This idea is similar to the idea of reduction of impurities in an oxide semiconductor film.

It is desirable to use a material with which a charge trapping center can be formed at the interface with the first metal oxide film 404 or the second metal oxide film 407 when the material is in contact with the first metal oxide film 404 or the second metal oxide film 407, for the gate insulating film 402 or the insulating film 409. By using such a material for the gate insulating film 402 or the insulating film 409, charge is trapped at the interface between the gate insulating film 402 and the first metal oxide film 404 or the interface between the insulating film 409 and the second metal oxide film 407, so that it is possible to sufficiently suppress trapping of charge at the interface between the first metal oxide film 404 and the oxide semiconductor film 403 or the interface between the second metal oxide film 407 and the oxide semiconductor film 403.

Specifically, the gate insulating film 402 and the insulating film 409 may each be formed to have a single-layer or layered structure using any of a silicon oxide, a silicon nitride, an aluminum oxide, an aluminum nitride, a mixed material of any of them, and the like. For example, in the case where a material containing a gallium oxide is used for the first metal oxide film 404 and the second metal oxide film 407, a silicon oxide, a silicon nitride, or the like is preferably used for the gate insulating film 402 and the insulating film 409. In addition, the energy gaps of the gate insulating film 402 and the insulating film 409 are desirably larger than those of the first metal oxide film 404 and the second metal oxide film 407, respectively, because the gate insulating film 402 and the insulating film 409 are in contact with the first metal oxide film 404 and the second metal oxide film 407, respectively.

Note that it is not necessary to limit the material of each of the gate insulating film 402 and the insulating film 409 to the above as long as a charge trapping center can be formed at the interface between the gate insulating film 402 and the first metal oxide film 404 or the interface between the insulating film 409 and the second metal oxide film 407. Further, treatment through which a charge trapping center is formed may be performed on the interface between the gate insulating film 402 and the first metal oxide film 404 or the interface between the insulating film 409 and the second metal oxide film 407. As such treatment, plasma treatment and treatment for adding an element (ion implantation or the like) are given, for example.

An insulator may further be formed over the transistor 310. Further, openings may be formed in the gate insulating film 402, the first metal oxide film 404, the second metal oxide film 407, the insulating film 409, and the like in order that the source electrode 405a and the drain electrode 405b may be electrically connected to a wiring. A second gate electrode may further be provided above the oxide semiconductor film 403. Note that it is not always necessary but desirable to process the oxide semiconductor film 403 into an island shape.

Figure 2:
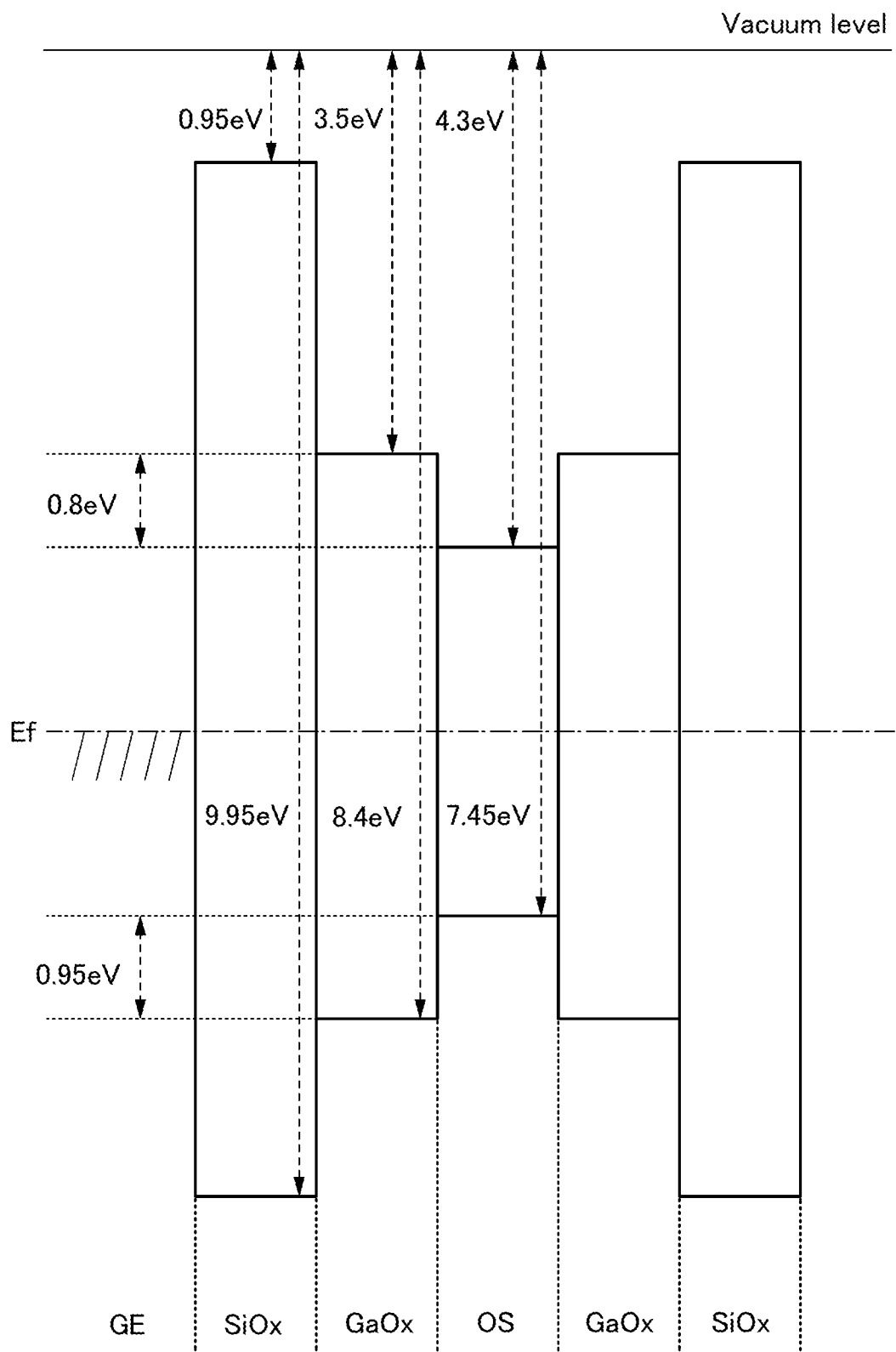
FIG. 2 is a band diagram of a transistor including an oxide semiconductor film and a metal oxide film.

FIG. 2 is an energy band diagram (schematic diagram) of the transistor 310, that is, an energy band diagram of the structure where the gate insulating film I1, the first metal oxide film MO1, the oxide semiconductor film OS, the second metal oxide film MO2, and the insulating film I2 are bonded to each other from the gate electrode GE side. FIG. 2 shows the case where a silicon oxide (with a band gap Eg of 8 eV to 9 eV) is used as each of the gate insulating film I1 and the insulating film I2, a gallium oxide (with a band gap Eg of 4.9 eV) is used as each of the first metal oxide film MO1 and the second metal oxide film MO2, and an In—Ga—Zn—O-based non-single-crystal film (with a band gap Eg of 3.15 eV) is used as the oxide semiconductor (OS) film, on the assumption of the ideal state where the insulating films, the metal oxide films, and the oxide semiconductor film are all intrinsic. Note that the energy difference between the vacuum level and the bottom of the conduction band of the silicon oxide is 0.95 eV, the energy difference between the vacuum level and the bottom of the conduction band of the gallium oxide is 3.5 eV, and the energy difference between the vacuum level and the bottom of the conduction band of the In—Ga—Zn—O-based non-single-crystal film is 4.3 eV.

As shown in FIG. 2, on the gate electrode GE side (the channel side) of the oxide semiconductor OS film, energy barriers of about 0.8 eV and about 0.95 eV exist at the interface between the oxide semiconductor and the metal oxide. On the back channel side (the side opposite to the gate electrode GE) of the oxide semiconductor OS film, similarly, energy barriers of about 0.8 eV and about 0.95 eV exist at the interface between the oxide semiconductor and the metal oxide. When such energy barriers exist at the interface between the oxide semiconductor and the metal oxide, transport of carriers at the interface can be prevented; thus, the carriers travel through the oxide semiconductor and do not travel from the oxide semiconductor to the metal oxide. As shown in FIG. 2, these beneficial results may be obtained when the oxide semiconductor film, the metal oxide layers, and the insulating layers are arranged such that the oxide semiconductor film is sandwiched between materials having progressively larger band gaps (i.e., the band gaps of the insulating layers are larger than the band gaps of the metal oxide layers) that are each larger than the band gap of the oxide semiconductor.

FIGS. 3A to 3G illustrate structural examples of transistors having different structures from that in FIGS. 1A to 1C.

Figure 3A:
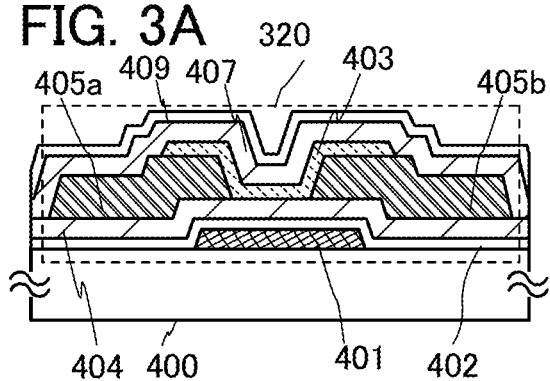
FIGS. 3A to 3G are cross-sectional views each illustrating an embodiment of a semiconductor device.

A transistor 320 in FIG. 3A is the same as the transistor 310 in FIGS. 1A to 1C in that it includes, over the substrate 400, the gate electrode 401, the gate insulating film 402, the first metal oxide film 404, the oxide semiconductor film 403, the source electrode 405a, the drain electrode 405b, the second metal oxide film 407, and the insulating film 409. The differences between the transistor 320 in FIG. 3A and the transistor 310 in FIGS. 1A to 1C are the positions where the oxide semiconductor film 403 is connected to the source electrode 405a and the drain electrode 405b. That is, in the transistor 310, the source electrode 405a and the drain electrode 405b are formed after formation of the oxide semiconductor film 403, whereby at least part of a top surface of the oxide semiconductor film 403 is in contact with the source electrode 405a and the drain electrode 405b. Meanwhile, in the transistor 320, the oxide semiconductor film 403 is formed after formation of the source electrode 405a and the drain electrode 405b, whereby at least part of a top surface of the source electrode 405a and part of a top surface of the drain electrode 405b are in contact with the oxide semiconductor film 403. The other components are the same as those in FIGS. 1A to 1C; thus, the description on FIGS. 1A to 1C can be referred to for the details.

Figure 3B:
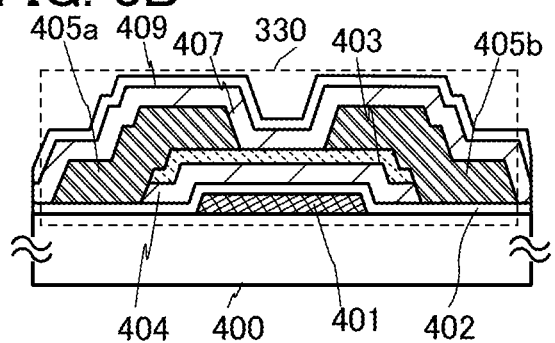

A transistor 330 in FIG. 3B is the same as the transistor 310 in FIGS. 1A to 1C in that it includes, over the substrate 400, the gate electrode 401, the gate insulating film 402, the first metal oxide film 404, the oxide semiconductor film 403, the source electrode 405a, the drain electrode 405b, the second metal oxide film 407, and the insulating film 409. The transistor 330 in FIG. 3B is different from the transistor 310 in FIGS. 1A to 1C in that the first metal oxide film 404 is processed to have an island shape.

In the transistor 330, the second metal oxide film 407 is provided so as to cover the source electrode 405a and the drain electrode 405b and contact the oxide semiconductor film 403 and the gate insulating film 402. The other components are the same as those in FIGS. 1A to 1C; thus, the description on FIGS. 1A to 1C can be referred to for the details.

Figure 3C:
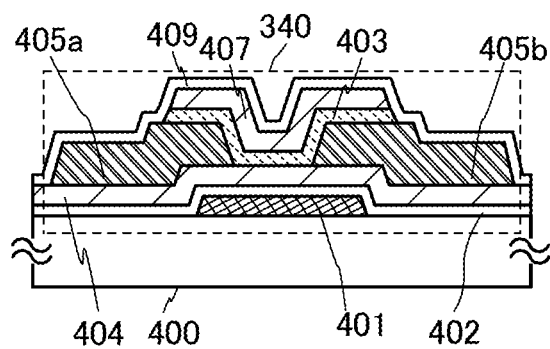

A transistor 340 in FIG. 3C is different from the transistor 320 in FIG. 3A in that the second metal oxide film 407 is processed to have an island shape. The other components are the same as those in FIG. 3A. In the transistor 340, the second metal oxide film 407 is provided in contact with the oxide semiconductor film 403.

Transistors 350, 360, 370, and 380 in FIGS. 3D to 3G are different from the transistors 310, 320, 330, 340, respectively, in that a conductive film 410 is provided over the insulating film 409 and in a region overlapping with a channel formation region of the oxide semiconductor film 403. The other components are the same as those in FIGS. 1A to 1C, FIG. 3A, FIG. 3B, or FIG. 3C.

<Example of Manufacturing Process of Transistor>

Examples of a manufacturing process of the transistor in FIGS. 1A to 1C and a manufacturing process of the transistor in FIG. 3A will be described below with reference to FIGS. 4A to 4E and FIGS. 5A to 5C.

<Manufacturing Process of Transistor 310>

An example of a manufacturing process of the transistor 310 in FIGS. 1A to 1C will be described with reference to FIGS. 4A to 4E.

First, a conductive film is formed over the substrate 400 having an insulating surface, and then, the gate electrode 401 is formed in a first photolithography process. Note that a resist mask may be formed by an ink jet method. When the resist mask is formed by an ink-jet method, a photomask is not used; therefore, manufacturing costs can be reduced.

Although there is no particular limitation on a substrate which can be used as the substrate 400 having an insulating surface as long as the substrate has heat resistance to a heat treatment to be performed later. For example, a glass substrate, a ceramic substrate, a quartz substrate, or a sapphire substrate can be used. Alternatively, a single crystal semiconductor substrate or a polycrystalline semiconductor substrate of silicon, silicon carbide, or the like; a compound semiconductor substrate of silicon germanium or the like; an SOI substrate, or the like may be used as long as the substrate has an insulating surface, and a semiconductor element may be provided over the substrate.

A flexible substrate may alternatively be used as the substrate 400. When a flexible substrate is used, the transistor including the oxide semiconductor film 403 may be formed directly on the flexible substrate, or the transistor including the oxide semiconductor film 403 may be formed over a different substrate and then separated to be transferred to the flexible substrate. In order to separate the transistor including the oxide semiconductor film 403 from the manufacturing substrate to transfer it to the flexible substrate, a separation layer is preferably formed between the manufacturing substrate and the transistor including the oxide semiconductor film 403.

An insulating film serving as a base film may be provided between the substrate 400 and the gate electrode 401. The base film may have a function of preventing diffusion of an impurity element from the substrate 400, and can be formed to have a single-layer or layered structure using one or more of a silicon nitride film, a silicon oxide film, a silicon nitride oxide film, and a silicon oxynitride film.

The gate electrode 401 may be formed to have a single-layer structure or a layered structure using any of metal materials such as molybdenum, titanium, tantalum, tungsten, aluminum, copper, neodymium, and scandium, and an alloy material containing any of these materials as its main component.

Figure 4A:
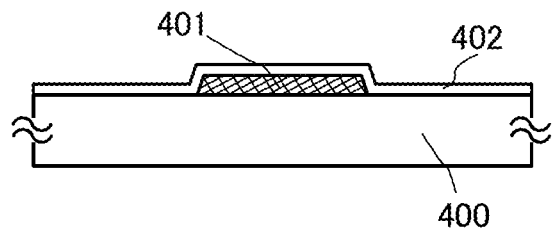
FIGS. 4A to 4E are cross-sectional views illustrating an example of a manufacturing process of the semiconductor device.

Next, the gate insulating film 402 is formed over the gate electrode 401 (FIG. 4A). It is desirable to use a material with which a charge trapping center can be formed at the interface with the first metal oxide film 404 when the material is in contact with the first metal oxide film 404, for the gate insulating film 402. By using such a material for the gate insulating film 402, charge is trapped at the interface between the gate insulating film 402 and the first metal oxide film 404, so that it is possible to sufficiently suppress trapping of charge at the interface between the first metal oxide film 404 and the oxide semiconductor film 403.

Specifically, the gate insulating film 402 contains a different constituent from the oxide semiconductor film 403 or the first metal oxide film 404 and may be formed to have a single-layer or layered structure using any of a silicon oxide film, a silicon nitride film, a silicon oxynitride film, a silicon nitride oxide film, an aluminum oxide film, an aluminum nitride film, an aluminum oxynitride film, an aluminum nitride oxide film, and a hafnium oxide film. Note that the gate insulating film 402 is preferably a silicon oxide film in order that impurities such as hydrogen and moisture may be removed from the first metal oxide film 404 efficiently in a step of heat treatment performed on the oxide semiconductor film 403 later. In addition, the energy gap of the gate insulating film 402 is desirably larger than that of the first metal oxide film 404 because the gate insulating film 402 is in contact with the first metal oxide film 404.

Note that it is not necessary to limit the material of the gate insulating film 402 to the above as long as a charge trapping center can be formed at the interface between the gate insulating film 402 and the first metal oxide film 404. Further, treatment through which a charge trapping center is formed may be performed on the interface between the gate insulating film 402 and the first metal oxide film 404. As such treatment, plasma treatment and treatment for adding an element (ion implantation or the like) are given, for example.

There is no particular limitation on the method for forming the gate insulating film 402, and for example, the gate insulating film 402 may be formed by a deposition method such as a plasma CVD method or a sputtering method.

Figure 4B:
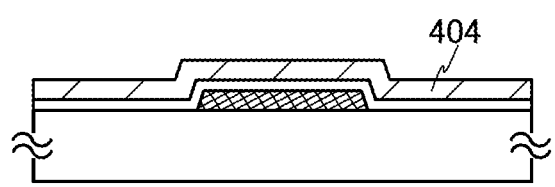

Next, the first metal oxide film 404 is formed over the gate insulating film 402 (FIG. 4B). It is desirable to use an oxide containing a constituent similar to that of the oxide semiconductor film 403 for the first metal oxide film 404. This is because such a material is compatible with the oxide semiconductor film 403 and thus, when it is used for the first metal oxide film 404, the state of the interface with the oxide semiconductor film can be kept favorably. That is to say, the use of the above material for the first metal oxide film 404 makes it possible to suppress trapping of charge at the interface between the first metal oxide film 404 and the oxide semiconductor film 403.

The first metal oxide film 404 needs to have a larger energy gap than the oxide semiconductor film 403. In addition, it is necessary that an energy barrier be formed between the first metal oxide film 404 and the oxide semiconductor film 403 so that carriers do not flow from the oxide semiconductor film 403 at room temperature (20° C.).

Considering that charge sources and charge trapping centers should be reduced, it is desirable to sufficiently reduce impurities such as hydrogen and water in the metal oxide film. This idea is similar to the idea of reduction of impurities in an oxide semiconductor film.

The first metal oxide film 404 preferably has a thickness large enough to keep a charge trapping center away from the oxide semiconductor film 403. Specifically, the first metal oxide film 404 preferably has a thickness of larger than 10 nm and smaller than or equal to 100 nm.

There is no particular limitation on the method for forming the first metal oxide film 404. For example, the first metal oxide film 404 may be formed by a deposition method such as a plasma CVD method or a sputtering method. A sputtering method or the like is appropriate in terms of low possibility of entry of hydrogen, water, and the like. On the other hand, a plasma CVD method or the like is appropriate in terms of an advantage of improving film quality.

Next, the oxide semiconductor film 403 is formed to a thickness of larger than or equal to 3 nm and smaller than or equal to 30 nm over the first metal oxide film 404 by a sputtering method. The above thickness is preferable because the transistor might possibly be normally on when the oxide semiconductor film 403 is too thick (e.g., the thickness is 50 nm or more). Note that the gate insulating film 402, the first metal oxide film 404, and the oxide semiconductor film 403 are preferably formed successively without being exposed to the air.

Note that before the oxide semiconductor film 403 is formed by a sputtering method, powdery substances (also referred to as particles or dust) attached on a surface of the first metal oxide film 404 are preferably removed by reverse sputtering in which an argon gas is introduced and plasma is generated. The reverse sputtering refers to a method in which a voltage is applied to a substrate side to generate plasma in the vicinity of the substrate to modify a surface. Note that instead of argon, a gas such as nitrogen, helium, or oxygen may be used.

As an oxide semiconductor used for the oxide semiconductor film 403, any of the oxide semiconductors can be used: a four-component metal oxide such as an In—Sn—Ga—Zn—O-based oxide semiconductor; three-component metal oxides such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, and a Sn—Al—Zn—O-based oxide semiconductor; two-component metal oxides such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, and an In—Ga—O-based oxide semiconductor; single-component metal oxides such as an In—O-based oxide semiconductor, a Sn—O-based oxide semiconductor, and a Zn—O-based oxide semiconductor. In addition, the above oxide semiconductors may contain $SiO_2$. Here, for example, an In—Ga—Zn—O-based oxide semiconductor means an oxide film containing indium (In), gallium (Ga), and zinc (Zn), and there is no particular limitation on the stoichiometric proportion. Further, the In-Ga—Zn-O-based oxide semiconductor may contain an element other than In, Ga, and Zn.

A thin film formed using a material expressed by the chemical formula of $InMO_3(ZnO)_m$ (m>0) may be used as the oxide semiconductor film 403. Here, M represents one or more metal elements selected from Ga, Al, Mn, and Co. For example, M may be Ga, Ga and Al, Ga and Mn, Ga and Co, or the like.

In this embodiment, the oxide semiconductor film 403 is formed by a sputtering method using an In—Ga—Zn—O-based oxide semiconductor film formation target. Further, the oxide semiconductor film 403 may be formed by a sputtering method in a rare gas (typically, argon) atmosphere, an oxygen atmosphere, or a mixed atmosphere of a rare gas and oxygen.

As a target for forming an In—Ga—Zn—O-based oxide semiconductor film as the oxide semiconductor film 403 by a sputtering method, for example, an oxide semiconductor film formation target with the following composition ratio may be used: the composition ratio of $In_2O_3:Ga_2O_3:ZnO$ is 1:1:1 [molar ratio]. Note that it is not necessary to limit the material and the composition ratio of the target to the above. For example, an oxide semiconductor film formation target with the following composition ratio may alternatively be used: the composition ratio of $In_2O_3:Ga_2O_3:ZnO$ is 1:1:2 [molar ratio].

In the case where an In—Zn—O-based material is used for the oxide semiconductor, a target with the following composition ratio is used: the composition ratio of In:Zn is 50:1 to 1:2 in an atomic ratio ($In_2O_3:ZnO$=25:1 to 1:4 in a molar ratio), preferably 20:1 to 1:1 in an atomic ratio ($In_2O_3:ZnO$=10:1 to 1:2 in a molar ratio), more preferably 15:1 to 1.5:1 in an atomic ratio ($In_2O_3:ZnO$=15:2 to 3:4 in a molar ratio). For example, a target used for the formation of an In—Zn—O-based oxide semiconductor has the following atomic ratio: the atomic ratio of In:Zn:O is X:Y:Z, where Z>1.5X+Y.

The fill rate of the oxide target is higher than or equal to 90% and lower than or equal to 100%, preferably, higher than or equal to 95% and lower than or equal to 99.9%. With the use of the oxide semiconductor film formation target with high fill rate, the oxide semiconductor film 403 can be formed to be dense.

A high-purity gas in which impurities such as hydrogen, water, a hydroxyl group, and hydride are removed is preferably used as a sputtering gas used for formation of the oxide semiconductor film 403.

For example, the oxide semiconductor film 403 is formed under the condition that the substrate 400 is placed in a deposition chamber kept under reduced pressure, and the substrate temperature is set to higher than or equal to 100° C. and lower than or equal to 600° C., preferably and higher than or equal to 200° C. and lower than or equal to 400° C. The concentration of an impurity contained in the oxide semiconductor film 403 can be reduced when film formation is performed while the substrate 400 is heated. Further, damage due to sputtering can be reduced. Then, a sputtering gas in which impurities such as hydrogen and moisture are sufficiently removed is introduced into the deposition chamber from which remaining moisture is being removed, and the oxide semiconductor film 403 is formed over the substrate 400 with the use of the target. To remove moisture remaining in the deposition chamber, an entrapment vacuum pump such as a cryopump, an ion pump, or a titanium sublimation pump is preferably used. Further, an evacuation means may be a turbo pump provided with a cold trap. In the deposition chamber which is evacuated with the cryopump, a hydrogen molecule, a compound containing a hydrogen atom, such as water ($H_2O$), (more preferably, also a compound containing a carbon atom), and the like are removed, whereby the concentration of an impurity in the oxide semiconductor film 403 formed in the deposition chamber can be reduced.

An example of the deposition condition is as follows: the distance between the substrate and the target is 100 mm, the pressure is 0.6 Pa, the direct-current (DC) power is 0.5 kW, and the deposition atmosphere is an oxygen atmosphere (the flow rate of the oxygen is 100%). Note that a pulse direct current power source is preferable because powdery substances (also referred to as particles or dust) generated in deposition can be reduced and the film thickness can be uniform.

After that, heat treatment (first heat treatment) is desirably performed on the oxide semiconductor film 403. Excessive hydrogen (including water and a hydroxyl group) in the oxide semiconductor film 403 is removed through the first heat treatment and the structure of the oxide semiconductor film 403 is modified, so that defect levels in an energy gap can be reduced. Moreover, excessive hydrogen (including water and a hydroxyl group) in the first metal oxide film 404 can also be removed through the first heat treatment. The first heat treatment is performed at higher than or equal to 250° C. and lower than or equal to 700° C., preferably higher than or equal to 450° C. and lower than or equal to 600° C. or lower than the strain point of the substrate.

The heat treatment may be performed, for example, in such a manner that an object to be processed is introduced into an electric furnace in which a resistance heating element or the like is used and heated in a nitrogen atmosphere at 450° C. for an hour. During the heat treatment, the oxide semiconductor film 403 is not exposed to the air to prevent the entry of water and hydrogen.

Note that a heat treatment apparatus is not limited to an electric furnace, and may include a device for heating an object to be processed by heat conduction or heat radiation from a medium such as a heated gas. For example, a rapid thermal anneal (RTA) apparatus such as a lamp rapid thermal anneal (LRTA) apparatus or a gas rapid thermal anneal (GRTA) apparatus can be used. An LRTA apparatus is an apparatus for heating an object to be processed by radiation of light (electromagnetic waves) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high temperature gas. As the high temperature gas, used is an inert gas which does not react with an object to be processed in heat treatment, such as nitrogen or a rare gas like argon.

For example, as the first heat treatment, GRTA treatment may be performed as follows. The object is put in an inert gas atmosphere that has been heated, heated for several minutes, and then taken out of the inert gas atmosphere. GRTA treatment enables high-temperature heat treatment in a short time. Moreover, GRTA treatment can be employed even when the temperature exceeds the upper temperature limit of the object. Note that the inert gas may be switched to a gas containing oxygen during the treatment. This is because defect levels in an energy gap due to oxygen vacancy can be reduced by performing the first heat treatment in an atmosphere containing oxygen.

Note that as the inert gas atmosphere, an atmosphere that contains nitrogen or a rare gas (e.g., helium, neon, or argon) as its main constituent and does not contain water, hydrogen, and the like is desirably used. For example, the purity of nitrogen or a rare gas such as helium, neon, or argon introduced into a heat treatment apparatus is 6N (99.9999%) or higher, preferably 7N (99.99999%) or higher (that is, the impurity concentration is 1 ppm or lower, preferably 0.1 ppm or lower).

In any case, the oxide semiconductor film 403 made to be i-type (intrinsic) or substantially i-type by reducing impurities by the first heat treatment is formed, whereby a transistor having extremely excellent characteristics can be realized.

The above heat treatment (first heat treatment) can be referred to as dehydration treatment, dehydrogenation treatment, or the like because of its advantageous effect of removing hydrogen, water, and the like. The dehydration treatment or dehydrogenation treatment may be performed at the timing, for example, after the oxide semiconductor film 403 is processed to have an island shape. Such dehydration treatment or dehydrogenation treatment may be conducted once or plural times.

Figure 4C:
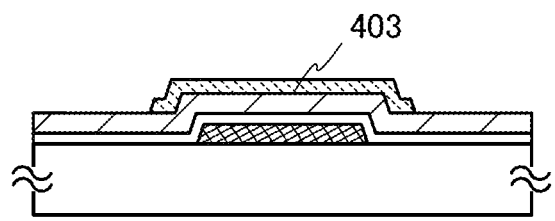

Then, the oxide semiconductor film 403 is preferably processed into the island-shaped oxide semiconductor film 403 in a second photolithography process (FIG. 4C). A resist mask for forming the island-shaped oxide semiconductor film 403 may be formed by an ink-jet method. When the resist mask is formed by an ink-jet method, a photomask is not used; therefore, manufacturing costs can be reduced. Note that the etching of the oxide semiconductor film 403 may be dry etching, wet etching, or both dry etching and wet etching.

Note that in the second photolithography process, the first metal oxide film 404 is patterned besides the oxide semiconductor film 403, so that the transistor 330 illustrated in FIG. 3B can be formed. In the case of the transistor 330, the oxide semiconductor film 403 and the first metal oxide film 404 are patterned using the same mask; thus, side edges of the oxide semiconductor film 403 in a channel length direction are aligned with those of the first metal oxide film 404.

Next, a conductive film for forming the source electrode and the drain electrode (including a wiring formed in the same layer as the source electrode and the drain electrode) is formed over the first metal oxide film 404 and the oxide semiconductor film 403. As the conductive film used for the source electrode and the drain electrode, for example, a metal film containing an element selected from Al, Cr, Cu, Ta, Ti, Mo, and W, or a metal nitride film containing any of the above elements as its constituent (e.g., a titanium nitride film, a molybdenum nitride film, or a tungsten nitride film) can be used. A high-melting-point metal film of Ti, Mo, W, or the like or a metal nitride film of any of these elements (a titanium nitride film, a molybdenum nitride film, or a tungsten nitride film) may be stacked on one of or both a bottom side and a top side of a metal film of Al, Cu, or the like. Alternatively, the conductive film used for the source electrode and the drain electrode may be formed using a conductive metal oxide. As the conductive metal oxide, an indium oxide ($In_2O_3$), a tin oxide ($SnO_2$), a zinc oxide (ZnO), an indium oxide-tin oxide alloy ($In_2O_3$—$SnO_2$, which is abbreviated to ITO), an indium oxide-zinc oxide alloy ($In_2O_3$—ZnO), or any of these metal oxide materials containing a silicon oxide may be used.

Through third photolithography process, a resist mask is formed over the conductive film and etching is selectively performed, so that the source electrode 405a and the drain electrode 405b are formed. Then, the resist mask is removed. Light exposure at the time of the formation of the resist mask in the third photolithography process is preferably performed using ultraviolet, a KrF laser beam, or an ArF laser beam. The channel length L of a transistor that is to be completed later is determined by a distance between bottom edges of the source electrode 405a and the drain electrode 405b, which are adjacent to each other over the oxide semiconductor film 403. In the case where the channel length L is less than 25 nm, the light exposure at the time of forming the resist mask in the third photolithography process is preferably performed using, for example, extreme ultraviolet having an extremely short wavelength of several nanometers to several tens of nanometers. In the light exposure using extreme ultraviolet, the resolution is high and the focus depth is large. Thus, the channel length L of the transistor formed later can be reduced, whereby the operation speed of a circuit can be increased.

In order to reduce the number of photomasks used in a photolithography process and reduce the number of photolithography processes, an etching step may be performed with the use of a multi-tone mask which is a light-exposure mask through which light is transmitted to have a plurality of intensities. A resist mask formed with the use of a multi-tone mask has a plurality of thicknesses and further can be changed in shape by etching; therefore, the resist mask can be used in a plurality of etching steps for processing into different patterns. Therefore, a resist mask corresponding to at least two or more kinds of different patterns can be formed with one multi-tone mask. Thus, the number of light-exposure masks can be reduced and the number of corresponding photolithography processes can be also reduced, whereby simplification of a process can be realized.

Note that when the conductive film is etched, the optimum etching condition is desirably set so that the oxide semiconductor film 403 can be prevented from being etched to be divided. However, it is difficult to obtain such an etching condition under which only the conductive film is etched and the oxide semiconductor film 403 is not etched at all. In some cases, only part of the oxide semiconductor film 403, for example, 5% to 50% in thickness of the oxide semiconductor film 403 is etched when the conductive film is etched, whereby the oxide semiconductor film 403 having a groove portion (a recessed portion) is formed.

After that, plasma treatment using a gas such as $N_2O$, $N_2$, or Ar may be performed so that water or the like adsorbed onto a surface of an exposed portion of the oxide semiconductor film 403 is removed. In the case where plasma treatment is performed, the second metal oxide film 407 which is to be in contact with the oxide semiconductor film 403 is desirably formed without being exposed to the air, following the plasma treatment.

Figure 4D:
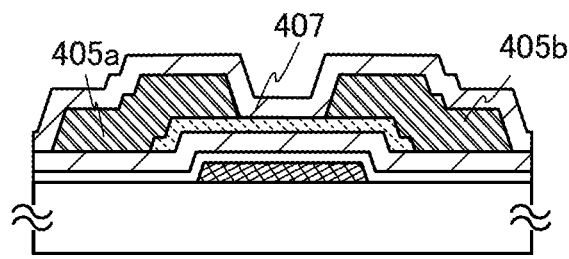

Next, the second metal oxide film 407 is formed so as to contact part of the oxide semiconductor film 403 and cover the source electrode 405a and the drain electrode 405b (see FIG. 4D).

Here, the second metal oxide film 407 desirably contains a constituent similar to that of the oxide semiconductor film 403 and is desirably formed using an oxide containing the main constituent material of the oxide semiconductor film 403. This is because such a material is compatible with the oxide semiconductor film 403 and thus, when it is used for the second metal oxide film 407, the state of the interface with the oxide semiconductor film can be kept favorably. That is to say, the use of the above material for the second metal oxide film 407 makes it possible to suppress trapping of charge at the interface between the second metal oxide film 407 and the oxide semiconductor film 403.

The second metal oxide film 407 needs to have a larger energy gap than the oxide semiconductor film 403. In addition, it is necessary that an energy barrier be formed between the second metal oxide film 407 and the oxide semiconductor film 403 so that carriers do not flow from the oxide semiconductor film 403 at room temperature (20° C.).

The second metal oxide film 407 is preferably formed by a method by which impurities such as water and hydrogen do not enter the second metal oxide film 407. When hydrogen is contained in the second metal oxide film 407, entry of the hydrogen into the oxide semiconductor film 403 or extraction of oxygen in the oxide semiconductor film 403 by hydrogen may occur, thereby causing the backchannel of the oxide semiconductor film 403 to have lower resistance (to be n-type), so that a parasitic channel may be formed. Therefore, it is important that a deposition method in which hydrogen is not used is employed in order to form the second metal oxide film 407 containing as little hydrogen as possible.

Therefore, the second metal oxide film 407 is preferably formed by a sputtering method, and a high-purity gas in which impurities such as hydrogen, water, a hydroxyl group, and hydride are removed is preferably used as a sputtering gas used for film formation.

The second metal oxide film 407 preferably has a thickness large enough to keep a charge trapping center away from the oxide semiconductor film 403. Specifically, the second metal oxide film 407 preferably has a thickness of larger than 10 nm and smaller than or equal to 100 nm.

Figure 4E:
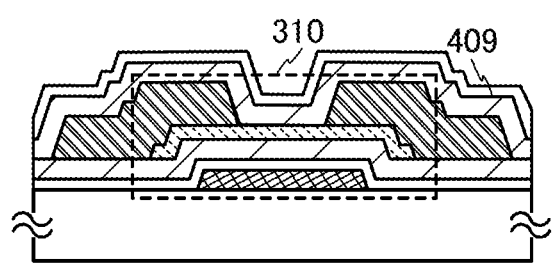

Then, the insulating film 409 is formed over the second metal oxide film 407 (FIG. 4E). The insulating film 409 may be formed using an inorganic film, for example, a single layer or a stack of any of oxide insulating films such as a silicon oxide film, a silicon oxynitride film, an aluminum oxide film, and an aluminum oxynitride film, and nitride insulating films such as a silicon nitride film, a silicon nitride oxide film, an aluminum nitride film, and an aluminum nitride oxide film. For example, a silicon oxide film and a silicon nitride film are sequentially formed to be stacked from the second metal oxide film 407 side by a sputtering method.

After that, second heat treatment is preferably performed while part of the oxide semiconductor film 403 (channel formation region) is in contact with the second metal oxide film 407. The second heat treatment is performed at higher than or equal to 250° C. and lower than or equal to 700° C., preferably higher than or equal to 450° C. and lower than or equal to 600° C. or less than the strain point of the substrate.

The second heat treatment may be performed in an atmosphere of nitrogen, oxygen, ultra-dry air (air in which a water content is 20 ppm or less, preferably 1 ppm or less, more preferably 10 ppb or less), or a rare gas (argon, helium, or the like). Note that it is preferable that water, hydrogen, and the like be not contained in the atmosphere of nitrogen, oxygen, ultra-dry air, a rare gas, or the like. Further, the purity of nitrogen, oxygen, or a rare gas introduced into a heat treatment apparatus is 6N (99.9999%) or higher, preferably 7N (99.99999%) or higher (that is, the impurity concentration is 1 ppm or lower, preferably 0.1 ppm or lower).

The second heat treatment is performed while the oxide semiconductor film 403 and the second metal oxide film 407 are in contact with each other. Thus, oxygen which is one of main constituent materials of the oxide semiconductor and may be reduced due to the dehydration (or dehydrogenation) treatment can be supplied from the second metal oxide film 407 containing oxygen to the oxide semiconductor film 403. Accordingly, charge trapping centers in the oxide semiconductor film 403 can be decreased. Through the above steps, the oxide semiconductor film 403 can be highly purified to be electrically i-type (intrinsic). Moreover, through this heat treatment, impurities in the first metal oxide film 404 or the second metal oxide film 407 can also be removed, resulting in high purification.

Note that in this embodiment, the second heat treatment is performed after formation of the insulating film 409;

however, there is no particular limitation on the timing of the second heat treatment as long as it is performed after formation of the second metal oxide film 407. For example, the second heat treatment may be performed after the second metal oxide film 407 is formed. Alternatively, in the case where the insulating film 409 is formed by stacking, for example, a silicon oxide film and a silicon nitride film, the second heat treatment may be performed after the silicon oxide film is formed over the second metal oxide film 407 and then, the silicon nitride film may be formed thereover. Alternatively, the second heat treatment may be performed following the first heat treatment, the first heat treatment may also serve as the second heat treatment, or the second heat treatment may also serve as the first heat treatment.

As described above, at least one of the first heat treatment and the second heat treatment is applied, whereby the oxide semiconductor film 403 can be highly purified so as to contain impurities other than main components of the oxide semiconductor film 403 as little as possible. The highly-purified oxide semiconductor film 403 contains extremely few (close to zero) carriers derived from a donor, and the carrier concentration thereof is lower than $1 \times 10^{14}/cm^3$, preferably lower than $1 \times 10^{12}/cm^3$, more preferably lower than $1 \times 10^{11}/cm^3$.

Through the above steps, the transistor 310 is formed (see FIG. 4E). The transistor 310 is a transistor including the oxide semiconductor film 403 which is highly purified by intentionally removing impurities such as hydrogen, moisture, a hydroxyl group, and hydride (also referred to as a hydrogen compound). Therefore, change in the electric characteristics of the transistor 310 is suppressed and the transistor 310 is electrically stable.

Figure 3D:
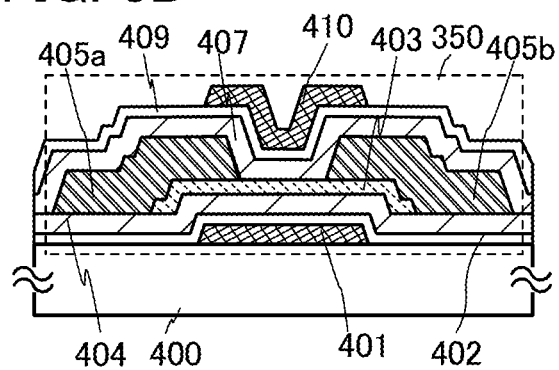

Note that after the insulating film 409 is formed, the conductive film 410 is formed over the insulating film 409, so that the transistor 350 in FIG. 3D can be formed. The conductive film 410 may be formed using a material and steps similar to those of the gate electrode 401. The conductive film 410 is provided so as to overlap with the channel formation region of the oxide semiconductor film 403, which leads to reduction of the amount of change in the threshold voltage of the transistor 350 between before and after a bias-temperature stress test (referred to as a BT test) for examining the reliability of the transistor 350. Note that the conductive film 410 may have the same potential as the gate electrode 401 or have a potential different from that of the gate electrode 401 and may function as a second gate electrode. Alternatively, the potential of the conductive film 410 may be GND or 0 V, or the conductive film 410 may be in a floating state.

Although not illustrated, a protective insulating film may be further formed so as to cover the transistor 350. As the protective insulating film, a silicon nitride film, a silicon nitride oxide film, an aluminum nitride film, or the like may be used.

In addition, a planarization insulating film may be formed over the transistors 310 and 350. As the planarization insulating film, an organic material with heat resistance, such as acrylic, polyimide, benzocyclobutene, polyamide, or epoxy may be used. Other than such organic materials, it is also possible to use a low-dielectric constant material (a low-k material), a siloxane-based resin, PSG (phosphosilicate glass), BPSG (borophosphosilicate glass), or the like. Note that the planarization insulating film may be formed by stacking a plurality of insulating films formed using any of these materials.

<Manufacturing Process of Transistor 320>

Figure 5A:
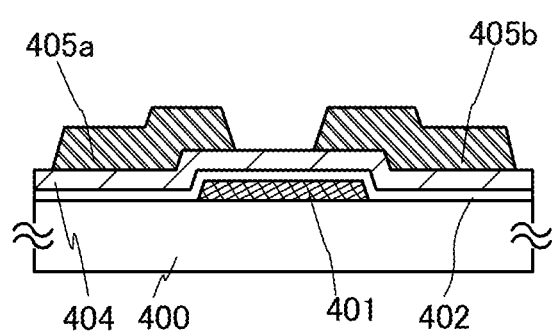
FIGS. 5A to 5C are cross-sectional views illustrating an example of a manufacturing process of the semiconductor device.

An example of a manufacturing process of the transistor 320 in FIG. 3A will be described with reference to FIGS. 5A to 5C.

As in the step illustrated in FIG. 4A, the gate electrode 401 is formed over the substrate 400, the gate insulating film 402 is formed so as to cover the gate electrode 401, the first metal oxide film 404 is formed in contact with the gate insulating film 402, and then a conductive film for forming the source electrode and the drain electrode (including a wiring formed in the same layer as the source electrode and the drain electrode) is formed over the first metal oxide film 404. Through second photolithography process, a resist mask is formed over the conductive film and etching is selectively performed, so that the source electrode 405a and the drain electrode 405b are formed. Then, the resist mask is removed (FIG. 5A).

Next, the oxide semiconductor film 403 is formed to a thickness of larger than or equal to 3 nm and smaller than or equal to 30 nm over the first metal oxide film 404, the source electrode 405a, and the drain electrode 405b by a sputtering method.

Note that before the oxide semiconductor film 403 is formed by a sputtering method, powdery substances (also referred to as particles or dust) attached on a surface of the first metal oxide film 404, the source electrode 405a, and the drain electrode 405b are preferably removed by reverse sputtering in which an argon gas is introduced and plasma is generated. Note that instead of argon, nitrogen, helium, oxygen, or the like may be used.

After that, heat treatment (first heat treatment) is desirably performed on the oxide semiconductor film 403. Excessive hydrogen (including water and a hydroxyl group) in the oxide semiconductor film 403 is removed through the first heat treatment and the structure of the oxide semiconductor film 403 is modified, so that defect levels in an energy gap can be reduced. Moreover, excessive hydrogen (including water and a hydroxyl group) in the first metal oxide film 404 can also be removed through the first heat treatment. The first heat treatment is performed at higher than or equal to 250° C. and lower than or equal to 700° C., preferably higher than or equal to 450° C. and lower than or equal to 600° C. or lower than the strain point of the substrate.

Figure 5B:
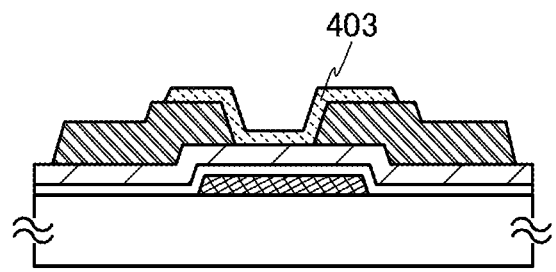

Then, the oxide semiconductor film 403 is processed into the island-shaped oxide semiconductor film 403 in a third photolithography process (FIG. 5B). A resist mask for forming the island-shaped oxide semiconductor film 403 may be formed by an ink-jet method. When the resist mask is formed by an ink jet method, a photomask is not used; therefore, manufacturing costs can be reduced. Note that the first heat treatment to the oxide semiconductor film 403 may be performed after patterning of the oxide semiconductor film 403. The oxide semiconductor film 403 is not necessarily patterned.

After that, plasma treatment using a gas such as $N_2O$, $N_2$, or Ar may be performed so that water or the like adsorbed onto a surface of an exposed portion of the oxide semiconductor film 403 is removed. In the case where plasma treatment is performed, the second metal oxide film 407 which is to be in contact with the oxide semiconductor film 403 is desirably formed without being exposed to the air, following the plasma treatment.

Next, the second metal oxide film 407 is formed so as to cover the source electrode 405a and the drain electrode 405b and contact the oxide semiconductor film 403. Then, the insulating film 409 is formed over the second metal oxide film 407.

After that, second heat treatment is preferably performed while the oxide semiconductor film 403 is in contact with the second metal oxide film 407. The second heat treatment is performed at higher than or equal to 250° C. and lower than or equal to 700° C., preferably higher than or equal to 450° C. and lower than or equal to 600° C. or less than the strain point of the substrate.

The second heat treatment may be performed in an atmosphere of nitrogen, oxygen, ultra-dry air (air in which a water content is 20 ppm or less, preferably 1 ppm or less, more preferably 10 ppb or less), or a rare gas (argon, helium, or the like). Note that it is preferable that water, hydrogen, and the like be not contained in the atmosphere of nitrogen, oxygen, ultra-dry air, a rare gas, or the like. Further, the purity of nitrogen, oxygen, or a rare gas introduced into a heat treatment apparatus is 6N (99.9999%) or higher, preferably 7N (99.99999%) or higher (that is, the impurity concentration is 1 ppm or lower, preferably 0.1 ppm or lower).

The second heat treatment is performed while the oxide semiconductor film 403 and the second metal oxide film 407 are in contact with each other. Thus, oxygen which is one of main constituent materials of the oxide semiconductor and may be reduced due to the dehydration (or dehydrogenation) treatment can be supplied from the second metal oxide film 407 containing oxygen to the oxide semiconductor film 403. Accordingly, charge trapping centers in the oxide semiconductor film 403 can be decreased. Through the above steps, the oxide semiconductor film 403 can be highly purified to be electrically i-type (intrinsic). Moreover, through this heat treatment, impurities in the first metal oxide film 404 or the second metal oxide film 407 can also be removed, resulting in high purification.

Figure 5C:
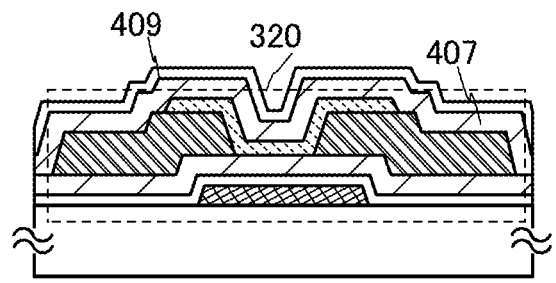

Through the above steps, the transistor 320 is formed (see FIG. 5C). The transistor 320 is a transistor including the oxide semiconductor film 403 which is highly purified by intentionally removing impurities such as hydrogen, moisture, a hydroxyl group, and hydride (also referred to as a hydrogen compound). Therefore, change in the electric characteristics of the transistor 320 is suppressed and the transistor 320 is electrically stable.

Note that in this embodiment, the second heat treatment is performed after formation of the insulating film 409; however, there is no particular limitation on the timing of the second heat treatment as long as it is performed after formation of the second metal oxide film 407.

Further, the second metal oxide film 407 is formed without pattering the oxide semiconductor film 403 after the oxide semiconductor film 403 is formed, and the second metal oxide film 407 and the oxide semiconductor film 403 are patterned using the same mask, so that the transistor 340 in FIG. 3C can be formed. In the case of the transistor 340, the oxide semiconductor film 403 and the second metal oxide film 407 are patterned using the same mask; thus, side edges of the oxide semiconductor film 403 in a channel length direction are aligned with those of the second metal oxide film 407. Note that in that case, the first heat treatment may be performed before the second metal oxide film 407 is formed or after the oxide semiconductor film 403 and the second metal oxide film 407 are successively formed. Alternatively, the second heat treatment may be performed following the first heat treatment, the first heat treatment may also serve as the second heat treatment, or the second heat treatment may also serve as the first heat treatment.

As described above, at least one of the first heat treatment and the second heat treatment is applied, whereby the oxide semiconductor film 403 can be highly purified so as to contain impurities other than main components of the oxide semiconductor film 403 as little as possible. The highly-purified oxide semiconductor film 403 contains extremely few (close to zero) carriers derived from a donor, and the carrier concentration thereof is lower than $1\times10^{14}/cm^3$, preferably lower than $1\times10^{12}/cm^3$, more preferably lower than $1\times10^{11}/cm^3$.

Figure 3E:
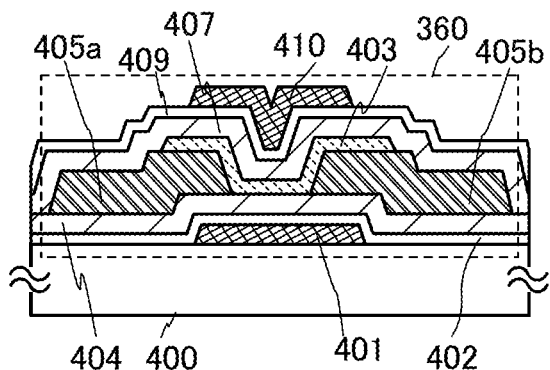
Figure 3F:
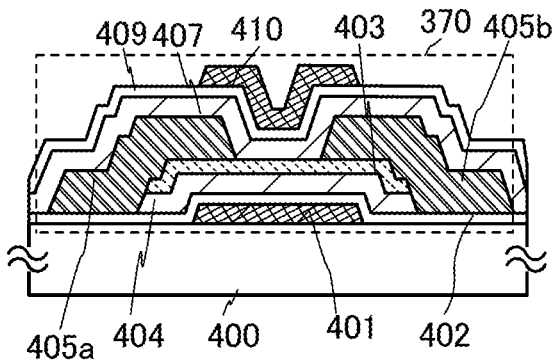
Figure 3G:
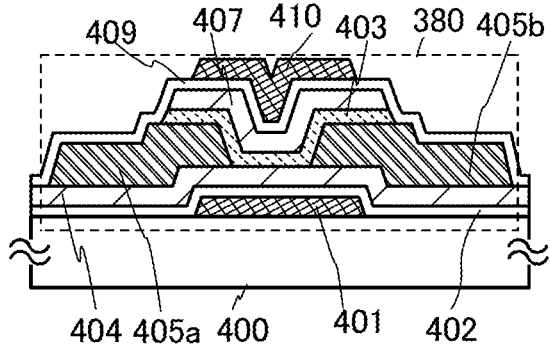

Note that after the insulating film 409 is formed in FIG. 5C, the conductive film 410 is formed over the insulating film 409, so that the transistor 360 in FIG. 3E can be formed. The conductive film 410 may be formed using a material and steps similar to those of the gate electrode 401.

As described above, in the transistor according to this embodiment, the top surface portion and the bottom surface portion of the oxide semiconductor film are each provided with the metal oxide film containing a constituent similar to that of the oxide semiconductor film, and an insulating film containing a different constituent from the metal oxide film and the oxide semiconductor film is formed in contact with a surface of the metal oxide film, which is opposite to the surface in contact with the oxide semiconductor film. Thus, the metal oxide film containing a material compatible with the oxide semiconductor film is provided in contact with the oxide semiconductor film, which suppresses trapping of charge or the like which can be generated due to the operation of a semiconductor device at the interface between the oxide semiconductor film and the metal oxide film Meanwhile, an insulator containing a material with which a charge trapping center can be formed at the interface is provided in contact with the metal oxide film, whereby the charge can be trapped at the interface between the metal oxide film and the insulator. Consequently, the oxide semiconductor film can be less adversely affected by charge, which suppresses fluctuation in the threshold voltage of the transistor due to trapping of charge at the interface of the oxide semiconductor film.

The oxide semiconductor film used for the active layer of the transistor is an oxide semiconductor film highly purified to be electrically i-type (intrinsic) by removing impurities such as hydrogen, moisture, a hydroxyl group, and hydride (also referred to as a hydrogen compound) from the oxide semiconductor through heat treatment and supplying oxygen which is a major constituent of the oxide semiconductor and is also reduced in a step of removing impurities. The transistor including the oxide semiconductor film highly purified in such a manner has electric characteristics which are less likely to change, and thus is electrically stable.

When charge is trapped at the interface of the oxide semiconductor film, the threshold voltage of the transistor shifts (for example, when positive charge is trapped on the back channel side, the threshold voltage of the transistor shifts in a negative direction). As one of factors of such charge trapping, the model where cations (or atoms which are sources of the cations) travel and are trapped can be supposed. In the transistor including an oxide semiconductor, such cation sources may be hydrogen atoms. In the disclosed invention, the highly-purified oxide semiconductor is used and is in contact with the stack of the metal oxide film and the insulating film, so that it is possible to suppress even charge trapping due to hydrogen, which may be caused in the above model. The above model is supposed to be realized when the ionization rate of hydrogen is, for example, about 10%.

Thus, a semiconductor device including an oxide semiconductor and having stable electric characteristics can be provided. Therefore, a semiconductor device with high reliability can be provided.

The structures, the methods, and the like described in this embodiment can be combined as appropriate with any of the structures, the methods, and the like described in the other embodiments.

Embodiment 2

A semiconductor device (also referred to as a display device) with a display function can be manufactured using the transistor an example of which is described in Embodiment 1. Some or all of driver circuits including the transistors can be formed over a substrate where a pixel portion is formed, whereby a system-on-panel can be obtained.

Figure 6A:
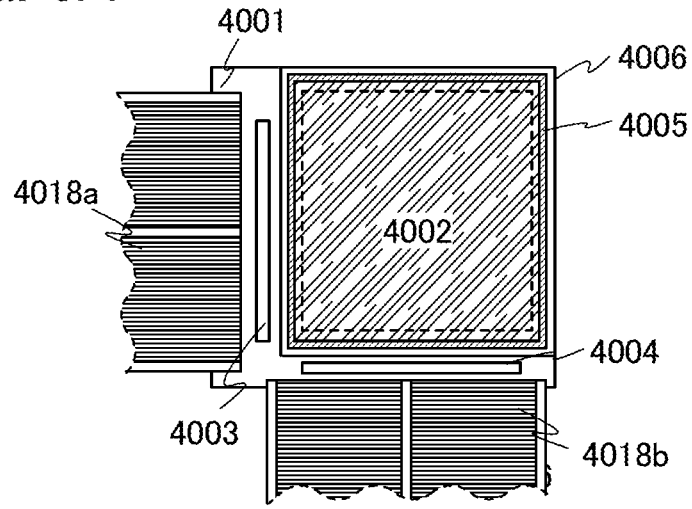
FIGS. 6A to 6C are views each illustrating an embodiment of a semiconductor device.

In FIG. 6A, a sealant 4005 is provided to surround a pixel portion 4002 provided over a first substrate 4001, and the pixel portion 4002 is sealed with the sealant 4005 and the second substrate 4006. In FIG. 6A, a scan line driver circuit 4004 and a signal line driver circuit 4003 each are formed using a single crystal semiconductor film or a polycrystalline semiconductor film over a substrate prepared separately, and mounted in a region different from the region surrounded by the sealant 4005 over the first substrate 4001. Various signals and potentials are supplied to the signal line driver circuit 4003 and the scan line driver circuit 4004 each of which is separately formed, and the pixel portion 4002, from flexible printed circuits (FPCs) 4018a and 4018b.

Figure 6B:
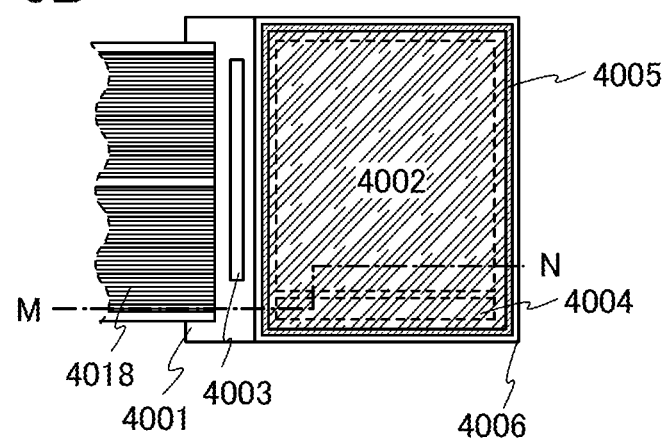
Figure 6C:
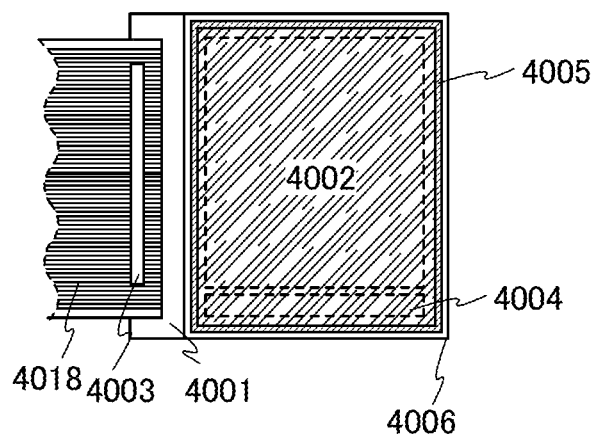

In FIGS. 6B and 6C, the sealant 4005 is provided to surround the pixel portion 4002 and the scan line driver circuit 4004 which are provided over the first substrate 4001. The second substrate 4006 is provided over the pixel portion 4002 and the scan line driver circuit 4004. Thus, the pixel portion 4002 and the scan line driver circuit 4004 are sealed together with a display element, by the first substrate 4001, the sealant 4005, and the second substrate 4006. In FIGS. 6B and 6C, the signal line driver circuit 4003 is formed using a single crystal semiconductor film or a polycrystalline semiconductor film over a substrate prepared separately, and mounted in a region different from the region surrounded by the sealant 4005 over the first substrate 4001. In FIGS. 6B and 6C, various signals and potentials are supplied to the separately formed signal line driver circuit 4003, the scan line driver circuit 4004, and the pixel portion 4002, from an FPC 4018.

Although FIGS. 6B and 6C each show the example in which the signal line driver circuit 4003 is formed separately and mounted on the first substrate 4001, the present invention is not limited to this structure. The scan line driver circuit may be separately formed and then mounted, or only part of the signal line driver circuit or part of the scan line driver circuit may be separately formed and then mounted.

Note that a method for connecting a separately formed driver circuit is not particularly limited, and a chip on glass (COG) method, a wire bonding method, a tape automated bonding (TAB) method, or the like can be used. FIG. 6A shows an example in which the signal line driver circuit 4003 and the scan line driver circuit 4004 are mounted by a COG method. FIG. 6B shows an example in which the signal line driver circuit 4003 is mounted by a COG method. FIG. 6C shows an example in which the signal line driver circuit 4003 is mounted by a TAB method.

The display device includes in its category a panel in which a display element is sealed, and a module in which an IC such as a controller is mounted on the panel.

Note that a display device in this specification means an image display device, a display device, or a light source (including a lighting device). The display device also includes the following modules in its category: a module to which a connector such as an FPC, a TAB tape, or a TCP is attached; a module having a TAB tape or a TCP at the tip of which a printed wiring board is provided; and a module in which an integrated circuit (IC) is directly mounted on a display element by a COG method.

The pixel portion and the scan line driver circuit provided over the first substrate include a plurality of transistors and any of the transistors which are described in Embodiment 1 can be applied.

As the display element provided in the display device, a liquid crystal element (also referred to as a liquid crystal display element) or a light-emitting element (also referred to as a light-emitting display element) can be used. The light-emitting element includes, in its category, an element whose luminance is controlled by a current or voltage, and specifically includes, in its category, an inorganic electroluminescent (EL) element, an organic EL element, and the like. Furthermore, a display medium whose contrast is changed by an electric effect, such as electronic ink, can be used.

Figure 7:
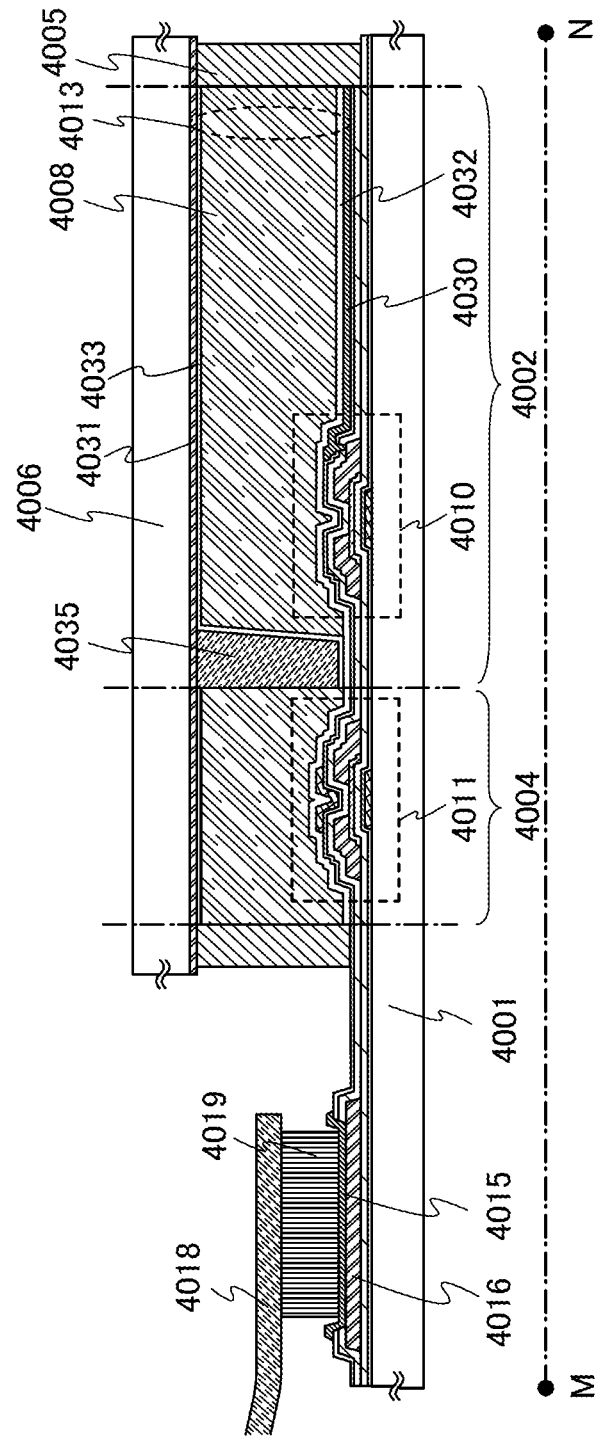
FIG. 7 is a cross-sectional view illustrating an embodiment of a semiconductor device.
Figure 8:
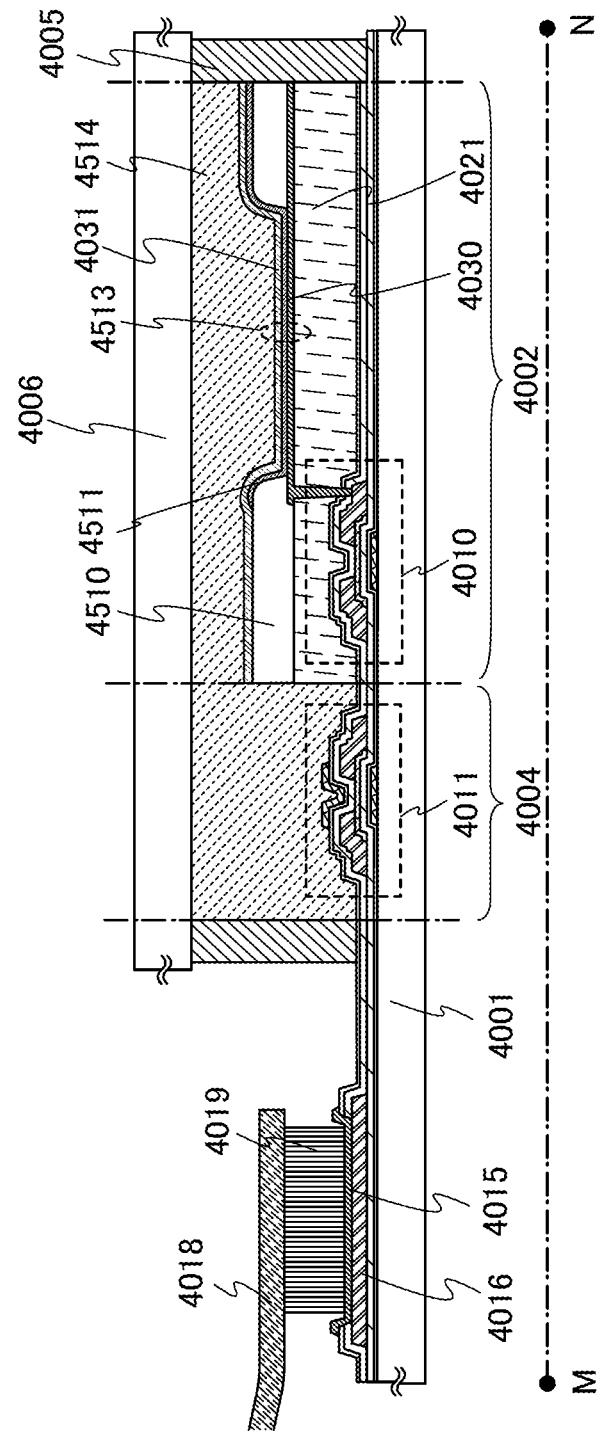
FIG. 8 is a cross-sectional view illustrating an embodiment of a semiconductor device.
Figure 9:
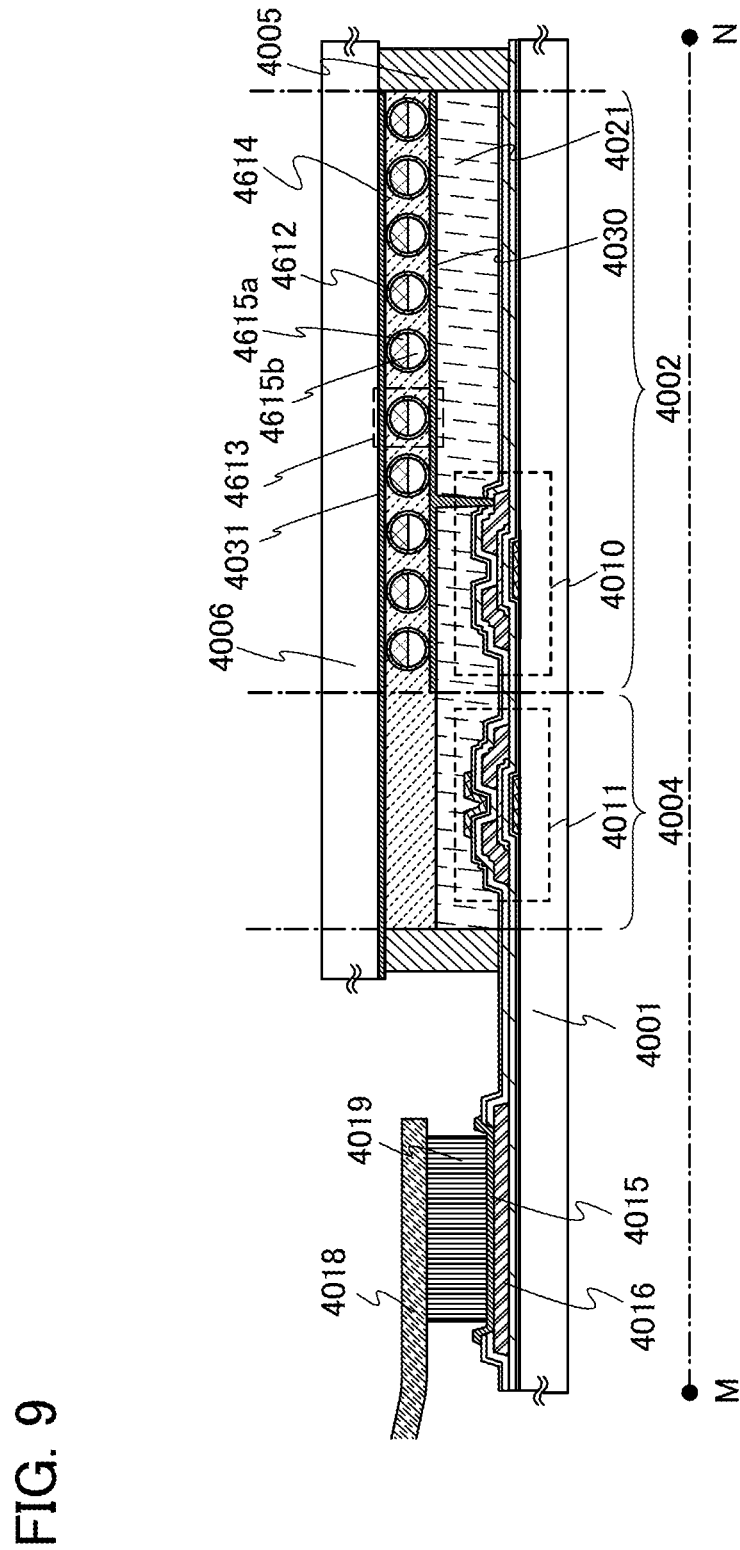
FIG. 9 is a cross-sectional view illustrating an embodiment of a semiconductor device.

One embodiment of the semiconductor device is described with reference to FIG. 7, FIG. 8, and FIG. 9. FIG. 7, FIG. 8, and FIG. 9 correspond to cross-sectional views taken along line M-N in FIG. 6B.

As shown in FIG. 7, FIG. 8, and FIG. 9, the semiconductor device includes a connection terminal electrode 4015 and a terminal electrode 4016. The connection terminal electrode 4015 and the terminal electrode 4016 are electrically connected to a terminal included in the FPC 4018 through an anisotropic conductive film 4019.

The connection terminal electrode 4015 is formed of the same conductive film as a first electrode layer 4030. The terminal electrode 4016 is formed of the same conductive film as a source electrode and a drain electrode of transistors 4010 and 4011.

Each of the pixel portion 4002 and the scan line driver circuit 4004 provided over the first substrate 4001 includes a plurality of transistors. In FIG. 7, FIG. 8, and FIG. 9, the transistor 4010 included in the pixel portion 4002 and the transistor 4011 included in the scan line driver circuit 4004 are shown as an example.

In this embodiment, any of the transistors shown in Embodiment 1 can be applied to the transistors 4010 and 4011. Variation in the electric characteristics of the transistors 4010 and 4011 is suppressed and the transistors 4010 and 4011 are electrically stable. As described above, a semiconductor device with high reliability as the semiconductor devices shown in FIG. 7, FIG. 8, and FIG. 9 can be obtained.

The transistor 4010 provided in the pixel portion 4002 is electrically connected to the display element to constitute a display panel. A variety of display elements can be used as the display element as long as display can be performed.

An example of a liquid crystal display device using a liquid crystal element as a display element is shown in FIG. 7. In FIG. 7, a liquid crystal element 4013 is a display element including the first electrode layer 4030, a second electrode layer 4031, and a liquid crystal layer 4008. Note that the insulating films 4032 and 4033 serving as alignment films are provided so that the liquid crystal layer 4008 is interposed therebetween. The second electrode layer 4031 is formed on the second substrate 4006 side. The first electrode layer 4030 and the second electrode layer 4031 are stacked with the liquid crystal layer 4008 interposed therebetween.

A spacer 4035 is obtained by selective etching of an insulating film and is provided in order to control the thickness (a cell gap) of the liquid crystal layer 4008. Note that in this embodiment, an example is described in which the spacer 4035 having a columnar shape is provided; however, a spherical spacer may alternatively be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

Alternatively, liquid crystal exhibiting a blue phase for which an alignment film is unnecessary may be used. A blue phase is one of liquid crystal phases generated just before a cholesteric phase changes into an isotropic phase while temperature of cholesteric liquid crystal is increased. Since the blue phase appears only in a narrow temperature range, a liquid crystal composition in which five weight percent or more of a chiral material is mixed is used for the liquid crystal layer in order to improve the temperature range. The liquid crystal composition which includes a liquid crystal showing a blue phase and a chiral agent has a short response time of 1 msec or less, has optical isotropy, which makes the alignment process unneeded, and has a small viewing angle dependence. In addition, since an alignment film does not need to be provided and rubbing treatment is unnecessary, electrostatic discharge damage caused by the rubbing treatment can be prevented and defects and damage of the liquid crystal display device can be reduced in the manufacturing process. Thus, productivity of the liquid crystal display device can be increased.

The specific resistivity of the liquid crystal material is $1 \times 10^9$ Ω·cm or more, preferably $1 \times 10^{11}$ Ω·cm or more, further preferably $1 \times 10^{12}$ Ω·cm or more. Note that the specific resistivity in this specification is measured at 20° C.

The size of a storage capacitor provided in the liquid crystal display device is set considering the leakage current of the transistor provided in the pixel portion or the like so that charge can be held for a predetermined period. Since the transistor including a high-purity oxide semiconductor film is used, a storage capacitor having capacitance which is ⅓ or less, preferably ⅕ or less with respect to a liquid crystal capacitance of each pixel is sufficient to be provided.

In the transistor used in this embodiment, which uses a highly-purified oxide semiconductor film, the current in an off state (the off-state current) can be made small. Therefore, an electrical signal such as an image signal can be held for a long period, and a writing interval can be set long when the power is on. Consequently, frequency of refresh operation can be reduced, which leads to an effect of suppressing power consumption.

The field-effect mobility of the transistor including a highly-purified oxide semiconductor film used in this embodiment can be relatively high, whereby high-speed operation is possible. Thus, by using the transistor in a pixel portion of the liquid crystal display device, a high-quality image can be provided. In addition, since the transistors can be separately provided in a driver circuit portion and a pixel portion over one substrate, the number of components of the liquid crystal display device can be reduced.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an antiferroelectric liquid crystal (AFLC) mode, and the like can be used.

A normally black liquid crystal display device such as a transmissive liquid crystal display device utilizing a vertical alignment (VA) mode is preferable. The vertical alignment mode is one of methods of controlling alignment of liquid crystal molecules of a liquid crystal display panel. The vertical alignment mode is a mode in which liquid crystal molecules are aligned vertically to a panel surface when voltage is not applied. Some examples are given as the vertical alignment mode. For example, a multi-domain vertical alignment (MVA) mode, a patterned vertical alignment (PVA) mode, an Advanced Super View (ASV) mode, and the like can be used. Moreover, it is possible to use a method called domain multiplication or multi-domain design, in which a pixel is divided into some regions (subpixels) and molecules are aligned in different directions in their respective regions.

In the display device, a black matrix (a light-blocking layer), an optical member (an optical substrate) such as a polarizing member, a retardation member, or an anti-reflection member, and the like are provided as appropriate. For example, circular polarization may be employed by using a polarizing substrate and a retardation substrate. In addition, a backlight, a side light, or the like may be used as a light source.

In addition, with the use of a plurality of light-emitting diodes (LEDs) as a backlight, a time-division display method (a field-sequential driving method) can be employed. With the field-sequential driving method, color display can be performed without using a color filter.

As a display method in the pixel portion, a progressive method, an interlace method, or the like can be employed. Color elements controlled in a pixel at the time of color display are not limited to three colors: R, G, and B (R, G, and B correspond to red, green, and blue respectively). For example, R, G, B, and W (W corresponds to white), or R, G, B, and one or more of yellow, cyan, magenta, and the like can be used. The sizes of display regions may be different between respective dots of color elements. Note that the present invention is not limited to the application to a display device for color display but can also be applied to a display device for monochrome display.

Alternatively, as the display element included in the display device, a light-emitting element utilizing electroluminescence can be used. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus the light-emitting organic compound is excited. The light-emitting organic compound returns to a ground state from the excited state, thereby emitting light. Owing to such a mechanism, such a light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that an example of an organic EL element as a light-emitting element is described here.

In order to extract light emitted from the light-emitting element, it is acceptable as long as at least one of a pair of electrodes is transparent. Then a transistor and a light-emitting element are formed over a substrate. The light-emitting element can have any of the following structure: a top emission structure in which light is extracted through the surface opposite to the substrate; a bottom emission structure in which light is extracted through the surface on the substrate side; or a dual emission structure in which light is extracted through the surface opposite to the substrate and the surface on the substrate side.

An example of a light-emitting device using a light-emitting element as a display element is shown in FIG. 8. A light-emitting element 4513 which is a display element is electrically connected to the transistor 4010 provided in the pixel portion 4002. The light-emitting element 4513 has a stacked-layer structure of the first electrode layer 4030, an electroluminescent layer 4511, and the second electrode layer 4031 but is not limited to this structure. The structure of the light-emitting element 4513 can be changed as appropriate depending on a direction in which light is extracted from the light-emitting element 4513, or the like.

A partition wall 4510 can be formed using an organic insulating material or an inorganic insulating material. It is particularly preferable that the partition wall 4510 be formed using a photosensitive resin material to have an opening portion over the first electrode layer 4030 so that a sidewall of the opening portion is formed as a tilted surface with continuous curvature.

The electroluminescent layer 4511 may be formed with either a single layer or a stacked layer of a plurality of layers.

A protective film may be formed over the second electrode layer 4031 and the partition wall 4510 in order to prevent entry of oxygen, hydrogen, moisture, carbon dioxide, or the like into the light-emitting element 4513. As the protective film, a silicon nitride film, a silicon nitride oxide film, a diamond like carbon (DLC) film, or the like can be formed. In a space sealed with the first substrate 4001, the second substrate 4006, and the sealant 4005, a filler 4514 is provided and tightly sealed. It is preferable that the light-emitting element be packaged (sealed) with a cover material with high air-tightness and little degasification or a protective film (such as a laminate film or an ultraviolet curable resin film) so that the light-emitting element is not exposed to the outside air, in this manner.

As the filler 4514, an ultraviolet curable resin or a thermosetting resin can be used as well as an inert gas such as nitrogen or argon, and polyvinyl chloride (PVC), acrylic, polyimide, an epoxy resin, a silicone resin, polyvinyl butyral (PVB), ethylene vinyl acetate (EVA), or the like can be used. For example, nitrogen is used for the filler.

If needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

An electronic paper in which electronic ink is driven can be provided as the display device. The electronic paper is also called an electrophoretic display device (electrophoretic display) and has advantages in that it has the same level of readability as regular paper, it has less power consumption than other display devices, and it can be set to have a thin and light form.

An electrophoretic display device can have various modes. An electrophoretic display device contains a plurality of microcapsules dispersed in a solvent or a solute, each microcapsule containing first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (which may be colorless).

Thus, an electrophoretic display device is a display device that utilizes a so-called dielectrophoretic effect by which a substance having a high dielectric constant moves to a high-electric field region.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material of any of these.

As an electronic paper, a display device using a twisting ball display method can be used. The twisting ball display method refers to a method in which spherical particles each colored in white and black are arranged between a first electrode layer and a second electrode layer which are electrode layers used for a display element, and a potential difference is generated between the first electrode layer and the second electrode layer to control orientation of the spherical particles, so that display is performed.

FIG. 9 shows an active matrix electronic paper as one embodiment of a semiconductor device. The electronic paper in FIG. 9 is an example of a display device using a twisting ball display method.

Between the first electrode layer 4030 connected to the transistor 4010 and the second electrode layer 4031 provided on the second substrate 4006, spherical particles 4613 each of which includes a black region 4615*a*, a white region 4615*b*, and a cavity 4612 around the regions which is filled with liquid, are provided. A space around the spherical particles 4613 is filled with a filler 4614 such as a resin. The second electrode layer 4031 corresponds to a common electrode (counter electrode). The second electrode layer 4031 is electrically connected to a common potential line.

Note that in FIG. 7, FIG. 8, and FIG. 9, a flexible substrate as well as a glass substrate can be used as the first substrate 4001 and the second substrate 4006. For example, a plastic substrate having light-transmitting properties can be used. For plastic, a fiberglass-reinforced plastics (FRP) plate, a polyvinyl fluoride (PVF) film, a polyester film, or an acrylic resin film can be used. A sheet with a structure in which an aluminum foil is sandwiched between PVF films or polyester films can also be used.

The insulating layer 4021 can be formed using an organic insulating material or an inorganic insulating material. Note that an organic insulating material having heat resistance, such as an acrylic resin, a polyimide, a benzocyclobutene-based resin, a polyamide, or an epoxy resin is preferably used as a planarizing insulating film Other than such organic insulating materials, it is possible to use a low-dielectric constant material (a low-k material), a siloxane-based resin, phosphosilicate glass (PSG), borophosphosilicate glass (BPSG), or the like. The insulating layer may be formed by stacking a plurality of insulating films formed of these materials.

There is no particular limitation on the method for forming the insulating layer 4021, and the insulating layer 4021 can be formed, depending on a material thereof, by a sputtering method, a spin coating method, a dipping method, a spray coating method, a droplet discharging method (e.g., an ink jet method, a screen printing method, or an offset printing method), a roll coating method, a curtain coating method, a knife coating method, or the like.

The display device performs display by transmitting light from a light source or a display element. Thus, the substrates and the thin films such as insulating films and conductive films provided in the pixel portion where light is transmitted have light-transmitting properties with respect to light in the visible-light wavelength range.

The first electrode layer and the second electrode layer (each of which may be called a pixel electrode layer, a common electrode layer, a counter electrode layer, or the like) for applying voltage to the display element may have light-transmitting properties or light-reflecting properties, which depends on the direction in which light is extracted, the position where the electrode layer is provided, and the pattern structure of the electrode layer.

A light-transmitting conductive material such as indium oxide containing tungsten oxide, indium zinc oxide containing tungsten oxide, indium oxide containing titanium oxide, indium tin oxide containing titanium oxide, ITO, indium zinc oxide, or indium tin oxide to which silicon oxide is added, can be used for the first electrode layer 4030 and the second electrode layer 4031.

The first electrode layer 4030 and the second electrode layer 4031 can be formed using one kind or plural kinds selected from metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy thereof; and a nitride thereof.

A conductive composition containing a conductive high molecule (also referred to as a conductive polymer) can be used for the first electrode layer 4030 and the second electrode layer 4031. As the conductive high molecule, a so-called π-electron conjugated conductive polymer can be used. For example, polyaniline or a derivative thereof, polypyrrole or a derivative thereof, polythiophene or a derivative thereof, and a copolymer of two or more of aniline, pyrrole, and thiophene or a derivative thereof can be given.

Since the transistor is easily broken due to static electricity or the like, a protective circuit for protecting the driver circuit is preferably provided. The protective circuit is preferably formed using a nonlinear element.

As described above, by using any of the transistors shown in Embodiment 1, a semiconductor device having a high reliability can be provided. Note that the transistors described in Embodiment 1 can be applied to not only semiconductor devices having the display functions described above but also semiconductor devices having a variety of functions, such as a power device which is mounted on a power supply circuit, a semiconductor integrated circuit such as an LSI, and a semiconductor device having an image sensor function of reading information of an object.

This embodiment can be implemented in appropriate combination with any of the other embodiments.

Embodiment 3

A semiconductor device disclosed in this specification can be applied to a variety of electronic appliances (including game machines). Examples of electronic appliances are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pachinko machine, and the like. Examples of electronic appliances each including the semiconductor device described in the above embodiment are described.

Figure 10A:
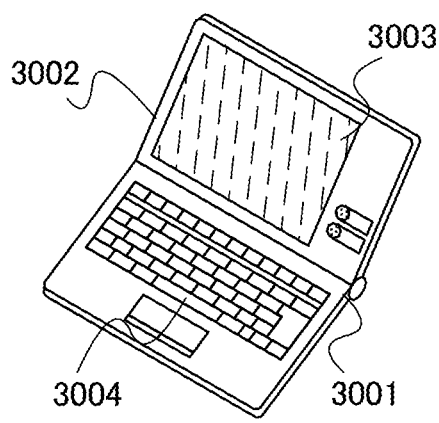
FIGS. 10A to 10F are views illustrating electronic devices.

FIG. 10A illustrates a laptop personal computer, which includes a main body 3001, a housing 3002, a display portion 3003, a keyboard 3004, and the like. By applying the semiconductor device described in Embodiment 1 or 2, the laptop personal computer can have high reliability.

Figure 10B:
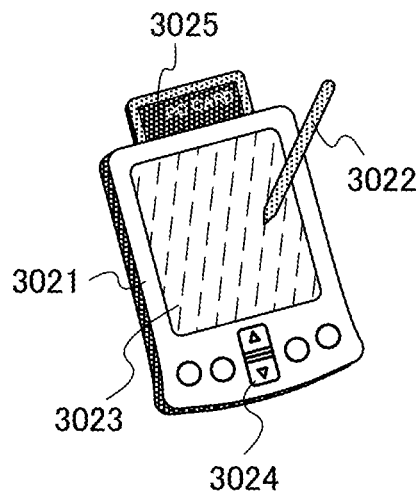

FIG. 10B is a portable information terminal (PDA) which includes a display portion 3023, an external interface 3025, an operation button 3024, and the like in a main body 3021. A stylus 3022 is included as an accessory for operation. By applying the semiconductor device described in Embodiment 1 or 2, the portable information terminal (PDA) can have higher reliability.

Figure 10C:
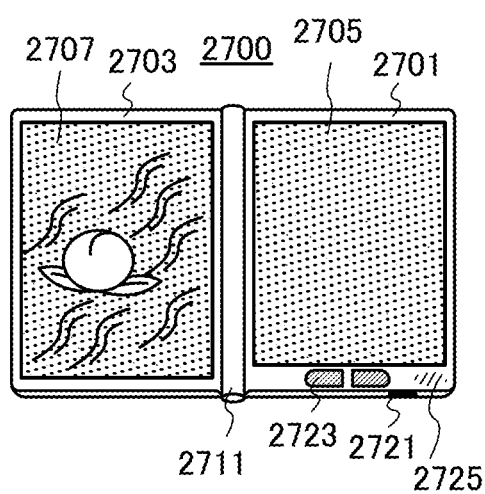

FIG. 10C illustrates an example of an electronic book reader. For example, an electronic book reader 2700 includes two housings, a housing 2701 and a housing 2703. The housing 2701 and the housing 2703 are combined with a hinge 2711 so that the electronic book reader 2700 can be opened and closed with the hinge 2711 as an axis. With such a structure, the electronic book reader 2700 can operate like a paper book.

A display portion 2705 and a display portion 2707 are incorporated in the housing 2701 and the housing 2703, respectively. The display portion 2705 and the display portion 2707 may display one image or different images. When the display portion 2705 and the display portion 2707 display different images, for example, text can be displayed on a display portion on the right side (the display portion 2705 in FIG. 10C) and graphics can be displayed on a display portion on the left side (the display portion 2707 in FIG. 10C). By applying the semiconductor device described in Embodiment 1 or 2, the electronic book reader 2700 can have high reliability.

FIG. 10C illustrates an example in which the housing 2701 is provided with an operation portion and the like. For example, the housing 2701 is provided with a power switch 2721, operation keys 2723, a speaker 2725, and the like. With the operation keys 2723, pages can be turned. Note that a keyboard, a pointing device, or the like may also be provided on the surface of the housing, on which the display portion is provided. Furthermore, an external connection terminal (an earphone terminal, a USB terminal, or the like), a recording medium insertion portion, and the like may be provided on the back surface or the side surface of the housing. Moreover, the electronic book reader 2700 may have a function of an electronic dictionary.

The electronic book reader 2700 may have a configuration capable of wirelessly transmitting and receiving data. Through wireless communication, desired book data or the like can be purchased and downloaded from an electronic book server.

Figure 10D:
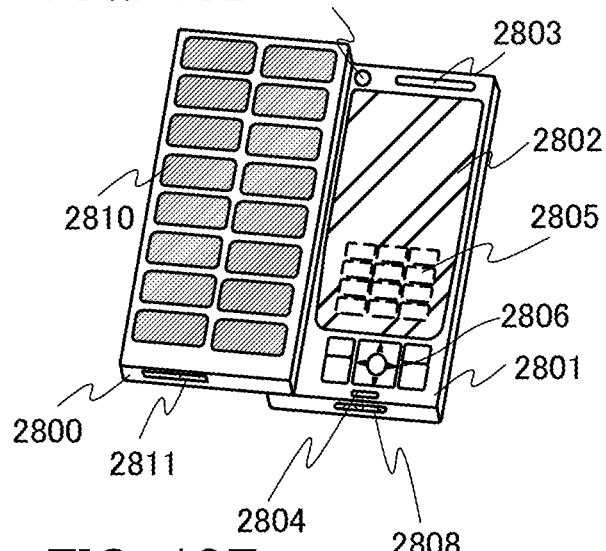

FIG. 10D illustrates a mobile phone, which includes two housings, a housing 2800 and a housing 2801. The housing 2801 includes a display panel 2802, a speaker 2803, a microphone 2804, a pointing device 2806, a camera lens 2807, an external connection terminal 2808, and the like. In addition, the housing 2800 includes a solar cell 2810 having a function of charge of the mobile phone, an external memory slot 2811, and the like. Further, an antenna is incorporated in the housing 2801. By applying the semiconductor device described in Embodiment 1 or 2, the mobile phone can have high reliability.

Further, the display panel 2802 is provided with a touch panel. A plurality of operation keys 2805 which are displayed as images is illustrated by dashed lines in FIG. 10D. Note that a boosting circuit by which a voltage output from the solar cell 2810 is increased to be sufficiently high for each circuit is also included.

In the display panel 2802, the display orientation can be appropriately changed depending on a usage pattern. Further, the display device is provided with the camera lens 2807 on the same surface as the display panel 2802, and thus it can be used as a video phone. The speaker 2803 and the microphone 2804 can be used for videophone calls, recording and playing sound, and the like as well as voice calls. Moreover, the housings 2800 and 2801 in a state where they are opened as illustrated in FIG. 10D can be slid so that one overlaps the other; therefore, the size of the mobile phone can be reduced, which makes the mobile phone suitable for being carried.

The external connection terminal 2808 can be connected to an AC adapter and various types of cables such as a USB cable, and charging and data communication with a personal computer are possible. Moreover, a larger amount of data can be saved and moved by inserting a recording medium to the external memory slot 2811.

Further, in addition to the above functions, an infrared communication function, a television reception function, or the like may be provided.

Figure 10E:
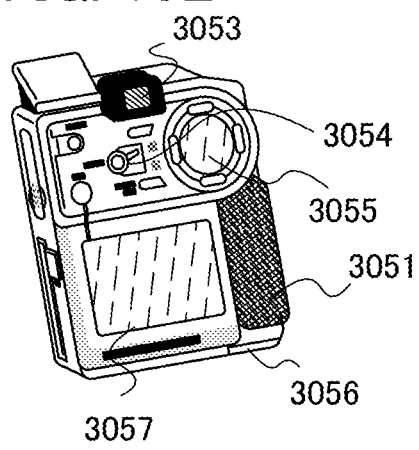

FIG. 10E illustrates a digital video camera which includes a main body 3051, a display portion A 3057, an eyepiece 3053, an operation switch 3054, a display portion B 3055, a battery 3056, and the like. By applying the semiconductor device described in Embodiment 1 or 2, the digital video camera can have high reliability.

Figure 10F:
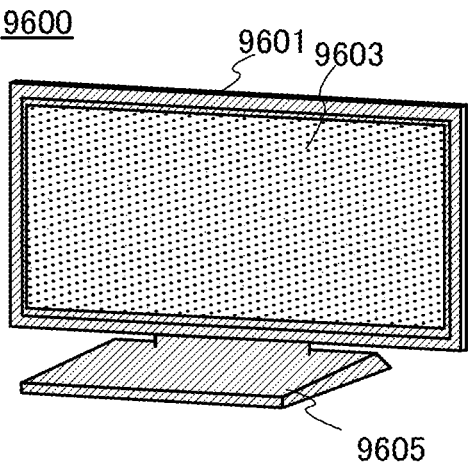

FIG. 10F illustrates an example of a television set. In a television set 9600, a display portion 9603 is incorporated in a housing 9601. The display portion 9603 can display images. Here, the housing 9601 is supported by a stand 9605. By applying the semiconductor device described in Embodiment 1 or 2, the television set 9600 can have high reliability.

The television set 9600 can be operated by an operation switch of the housing 9601 or a separate remote controller. Further, the remote controller may be provided with a display portion for displaying data output from the remote controller.

Note that the television set 9600 is provided with a receiver, a modem, and the like. With the use of the receiver, general television broadcasting can be received. Furthermore, when the display device is connected to a communication network with or without wires via the modem, one-way (from a sender to a receiver) or two-way (between a sender and a receiver or between receivers) information communication can be performed.

This embodiment can be implemented in appropriate combination with any of the other embodiments.

This application is based on Japanese Patent Application serial no. 2010-086397 filed with the Japan Patent Office on Apr. 2, 2010, the entire contents of which are hereby incorporated by reference.

The invention claimed is:

1. A semiconductor device comprising:
 a pixel portion including a first transistor; and
 a driver circuit comprising a second transistor,
 wherein each of the first transistor and the second transistor comprises:
  a first gate electrode over a substrate;
  a first metal oxide film over the first gate electrode;
  an oxide semiconductor film in contact with the first metal oxide film;
  a source electrode and a drain electrode in contact with the oxide semiconductor film; and
  a second metal oxide film in contact with the oxide semiconductor film,
 wherein each of the first metal oxide film and the second metal oxide film comprises one or more constituent metal elements of the oxide semiconductor film, and
 wherein the second transistor further comprises a second gate electrode over the second metal oxide film.

2. The semiconductor device according to claim 1, wherein at least part of a top surface of the oxide semiconductor film is in contact with the source electrode and the drain electrode.

3. The semiconductor device according to claim 1, wherein the first metal oxide film and the second metal oxide film each have a larger energy gap than the oxide semiconductor film.

4. The semiconductor device according to claim 1, wherein an energy at a bottom of a conduction band of each of the first metal oxide film and the second metal oxide film is higher than an energy at a bottom of a conduction band of the oxide semiconductor film.

5. The semiconductor device according to claim 1, wherein the oxide semiconductor film comprises In, Ga, and Zn.

6. A semiconductor device comprising:
 a pixel portion including a first transistor and a light-emitting element; and
 a driver circuit comprising a second transistor,
 wherein each of the first transistor and the second transistor comprises:
  a first gate electrode over a substrate;
  a first oxide film over the substrate;
  an oxide semiconductor film over the first oxide film, wherein the oxide semiconductor film and the first gate electrode overlap with each other;
  a source electrode and a drain electrode over the first oxide film; and
  second oxide film over the oxide semiconductor film, the second oxide film having an island-shaped,
 wherein a bottom surface of the oxide semiconductor film of the first transistor is in contact with a top surface and a side surface of each of the source electrode and the drain electrode of the first transistor, wherein a bottom surface of the oxide semiconductor film of the second transistor is in contact with a top surface and a side surface of each of the source electrode and the drain electrode of the second transistor, wherein the second transistor further comprises a second gate electrode overlapping with the second oxide film and the first gate electrode of the second transistor, wherein the second gate electrode of the second transistor has the same potential as the first gate electrode of the second transistor, and wherein one of the source electrode and the drain electrode of the first transistor is electrically connected to a pixel electrode of the light-emitting element.

7. The semiconductor device according to claim 6, wherein each of the first oxide film and the second oxide film is a metal oxide film.

8. The semiconductor device according to claim 6, wherein the oxide semiconductor film comprises In, Ga, and Zn.

9. The semiconductor device according to claim 6, wherein the first gate electrode comprises a layered structure including a titanium layer and an aluminum layer.

10. The semiconductor device according to claim 6, wherein each of the source electrode and the drain electrode comprises a molybdenum film.

* * * * *